(12) United States Patent
Liaw

(10) Patent No.: US 12,148,463 B2
(45) Date of Patent: Nov. 19, 2024

(54) DUAL PORT MEMORY CELL WITH MULTIPLE METAL LAYERS

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 206 days.

(21) Appl. No.: 17/671,288

(22) Filed: Feb. 14, 2022

(65) Prior Publication Data

US 2023/0013845 A1 Jan. 19, 2023

Related U.S. Application Data

(60) Provisional application No. 63/222,548, filed on Jul. 16, 2021.

(51) Int. Cl.
*G11C 11/412* (2006.01)
*H10B 10/00* (2023.01)

(52) U.S. Cl.
CPC ............ *G11C 11/412* (2013.01); *H10B 10/12* (2023.02)

(58) Field of Classification Search
CPC ......... G11C 11/412; G11C 8/16; H10B 10/12; H01L 27/0207
See application file for complete search history.

(56) References Cited

U.S. PATENT DOCUMENTS

| | | |
|---|---|---|
| 7,260,442 B2 | 8/2007 | Hwang et al. |
| 8,009,463 B2 | 8/2011 | Liaw |
| 8,189,368 B2 | 5/2012 | Liaw |
| 8,315,084 B2 | 11/2012 | Liaw et al. |
| 8,675,397 B2 | 3/2014 | Liaw |
| 8,995,176 B2 | 3/2015 | Liaw |
| 9,099,172 B2 | 8/2015 | Liaw |
| 9,256,709 B2 | 2/2016 | Yu et al. |
| 9,373,386 B2 | 6/2016 | Liaw |
| 9,418,728 B2 | 8/2016 | Liaw |
| 9,646,974 B1 | 5/2017 | Liaw |
| 9,773,545 B2 | 9/2017 | Liaw |
| 9,824,747 B2 | 11/2017 | Liaw |
| 9,858,985 B2 | 1/2018 | Liaw |
| 9,916,893 B2 | 3/2018 | Liaw |

(Continued)

*Primary Examiner* — Jerome Leboeuf
(74) *Attorney, Agent, or Firm* — Hauptman Ham, LLP

(57) ABSTRACT

A dual-port memory cell includes first pull-up and pull-down transistors coupled at a first node between supply and reference voltage nodes, second pull-up and pull-down transistors coupled at a second node between the supply and reference voltage nodes, and first through fourth bit line landing pads in a metal layer. A first pass-gate transistor is coupled between the first bit line landing pad and the first node, a second pass-gate transistor is coupled between the second bit line landing pad and the second node, a third pass-gate transistor is coupled between the third bit line landing pad and the first node, and a fourth pass-gate transistor is coupled between the fourth bit line landing pad and the second node. The first node includes an interconnect between the first and second bit line landing pads, and the second node includes an interconnect between the third and fourth bit line landing pads.

20 Claims, 18 Drawing Sheets

(56) References Cited

U.S. PATENT DOCUMENTS

| | | | |
|---|---|---|---|
| 2012/0086082 A1* | 4/2012 | Malinge | G11C 11/412 |
| | | | 257/E21.532 |
| 2014/0040838 A1 | 2/2014 | Liu et al. | |
| 2015/0278429 A1 | 10/2015 | Chang | |
| 2019/0006375 A1* | 1/2019 | Morimoto | G06F 30/392 |
| 2019/0198508 A1* | 6/2019 | Sharma | G11C 11/417 |

* cited by examiner

DUAL PORT MEMORY CELL WITH MULTIPLE METAL LAYERS

PRIORITY CLAIM

The present application claims the priority of U.S. Provisional Application No. 63/222,548, filed Jul. 16, 2021, which is incorporated herein by reference in its entirety.

BACKGROUND

In deep sub-micron integrated circuit (IC) technology, an embedded static random access memory (SRAM) device is a storage unit of high speed communication, image processing and system-on-chip (SOC) products. For example, a dual port (DP) SRAM device allows parallel operation, such as 1R (read) 1W (write), or 2R in one cycle, and therefore has higher bandwidth than a single port SRAM. In advanced technologies with decreased feature size and increased packing density, low loading and high speed of the cell structure are factors in embedded memory and SOC products.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
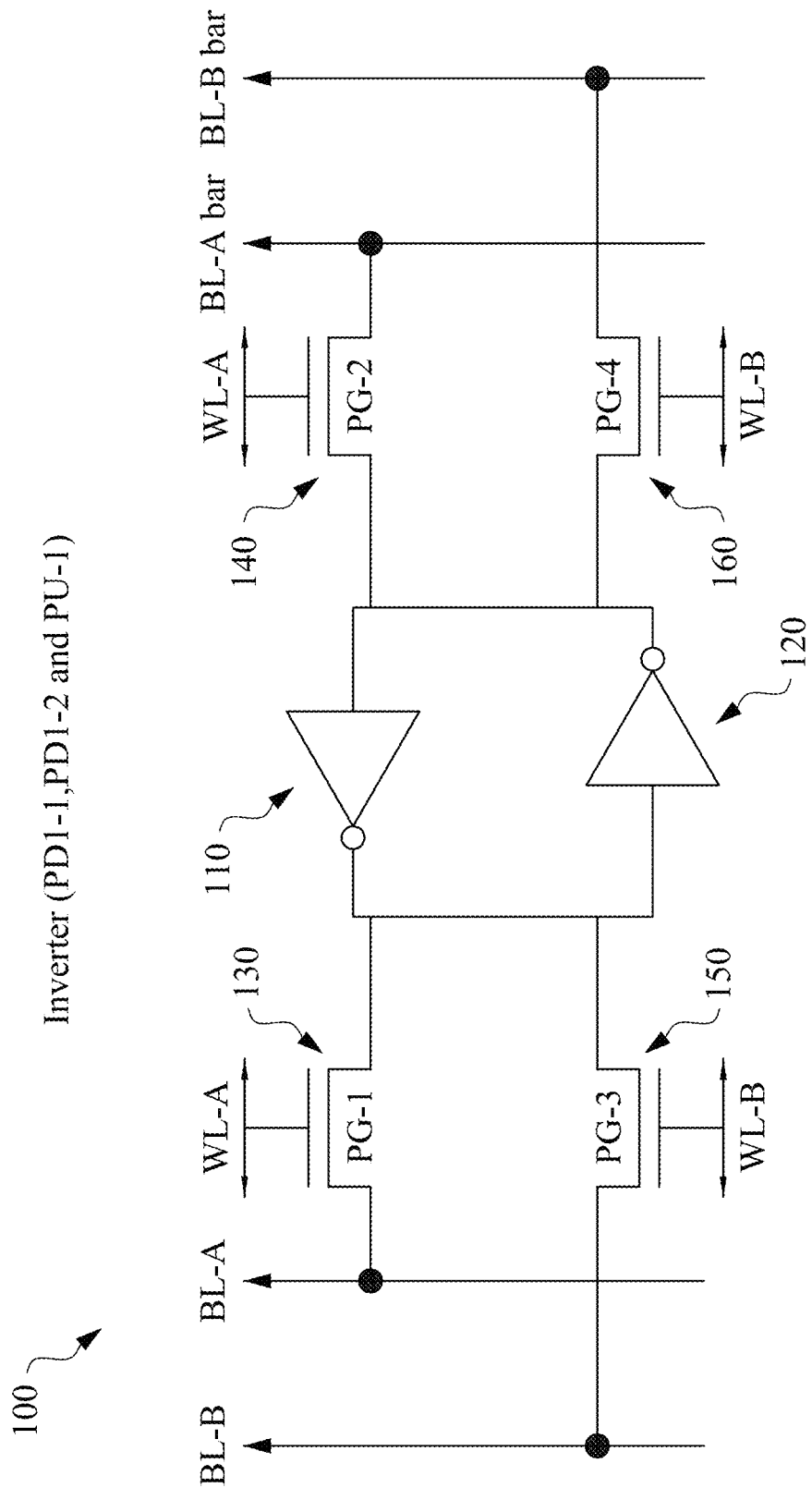
FIGS. 1A-1B are schematic views of a DP SRAM cell, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a DP SRAM cell are disclosed. The DP SRAM cell has a routing structure for word lines and bit lines that allows for a reduced area footprint with reduced capacitance and resistivity in comparison to previous DP SRAM designs. In particular, landing pads included in a first metal layer enable the bit lines and word lines to be located in different overlying metal layers, and subsequently widened in comparison to DP SRAM cells having both bit lines and word lines in a same metal layer. In some embodiments, power conductors, bit lines, and word lines are all located in different metal layers. In some embodiments, word line landing pads are located at the boundaries of the DP SRAM cells allowing for adjacent DP SRAM cells to share the landing pads and therefore reduce the size of an array of the DP SRAM cells.

Figure 1B:
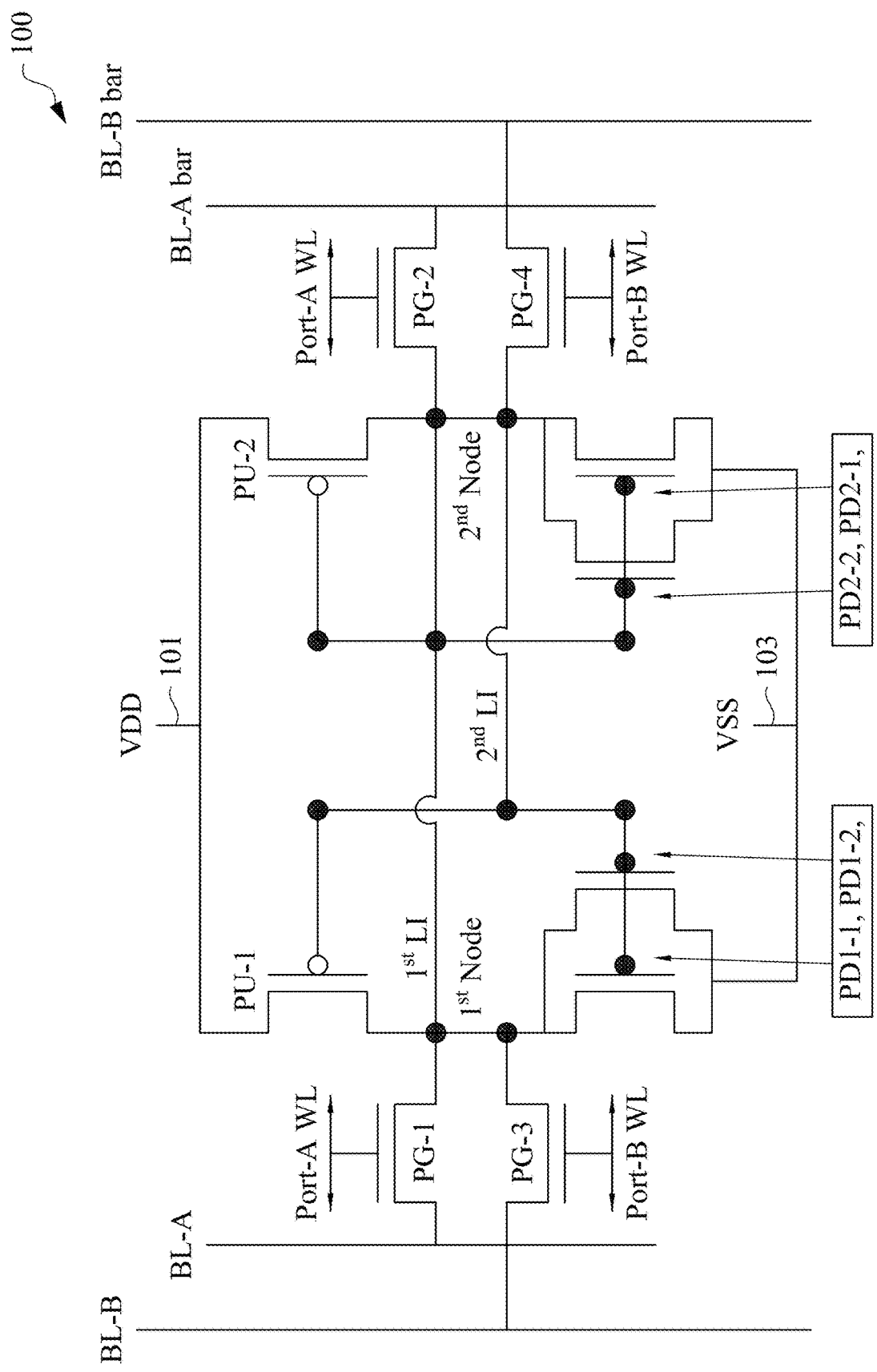

FIGS. 1A-1B are schematic views of a DP SRAM cell 100, in accordance with some embodiments.

The DP SRAM cell 100 includes a first inverter 110 and a second inverter 120 that are cross-coupled. The first inverter 110 includes a first pull-up (PU) device formed with a p-type metal-oxide-semiconductor field-effect transistor (PMOSFET), referred to as PU-1. The first inverter 110 also includes a plurality of first pull-down (PD) devices formed with n-type MOSFET (NMOSFET) and connected in parallel, referred to as PD1-1 and PD1-2. The second inverter 120 includes a second PU device formed with a PMOSFET, referred to as PU-2. The second inverter 120 also includes a plurality of second PD devices formed with NMOSFETs and connected in parallel, referred to as PD2-1 and PD2-2.

Still referring to FIGS. 1A-1B, the drains of PU-1, PD1-1, and PD1-2 are electrically connected together, defining a first drain node (or first node, referred to as 1st Node). The drains of PU-2, PD2-1, and PD2-2 are electrically connected together, defining a second drain node (or second node, referred to as 2nd Node). The gates of PU-1, PD1-1, and PD1-2 are electrically connected and coupled to the second node (2nd Node). The gates of PU-2, PD-2-1, and PD2-2 are electrically connected and coupled to the first node (1st Node). The sources of PU-1 and PU-2 are electrically connected to a power voltage node 101. The power voltage node 101 is configured to receive a power source voltage VDD. In some embodiments, as discussed below, one or more power voltage conductors are connected to the power voltage node to distribute the power source voltage VDD to the different components of the DP SRAM cell 100. The sources of PD1-1, PD1-2, PD2-1, and PD2-2 are electrically connected to a complementary reference voltage node 103. In some embodiments, as discussed below, reference voltage conductors are coupled to the reference voltage node 103 to distribute the reference voltage to the different components of the DP SRAM cell 100.

As shown in FIG. 1B, the DP SRAM cell 100 further includes a first port (port-A) and a second port (port-B). In the embodiment depicted in FIG. 1B, port-A includes at least two pass gate (PG) devices, referred to as PG-1 and PG-2, and port-B includes at least two PG devices, referred to as PG-3 and PG-4. In the embodiment depicted in FIG. 1B, each of the PG devices is a NMOSFET. In some embodiments, the drain of PG-1 is electrically connected to a first bit line (referred to as BL-A), the source of PG-1 is electrically connected to the first node (1st Node), and the gate of PG-1 is electrically connected to a first word line (referred to as WL-A). The drain of PG-2 is electrically connected to a first bit line bar (BL-A bar), the source of PG-2 is electrically connected to the second node (2nd Node), and the gate of PG-2 is electrically connected to the first word line (WL-A). The drain of PG-3 is electrically connected to a second bit line (BL-B), the source of PG-3 is electrically connected to the first node (1st Node), and the gate of PG-3 is electrically connected to a second word line (WL-B). The drain of PG-4 is electrically connected to a second bit line bar (BL-B bar), the source of PG-4 is electrically connected to the second node (2nd Node), and the gate of PG-4 is electrically connected to the second word line (WL-B). In operation, the word lines and the bit lines serve the read and/or write functionalities, in some embodiments.

Figure 2:
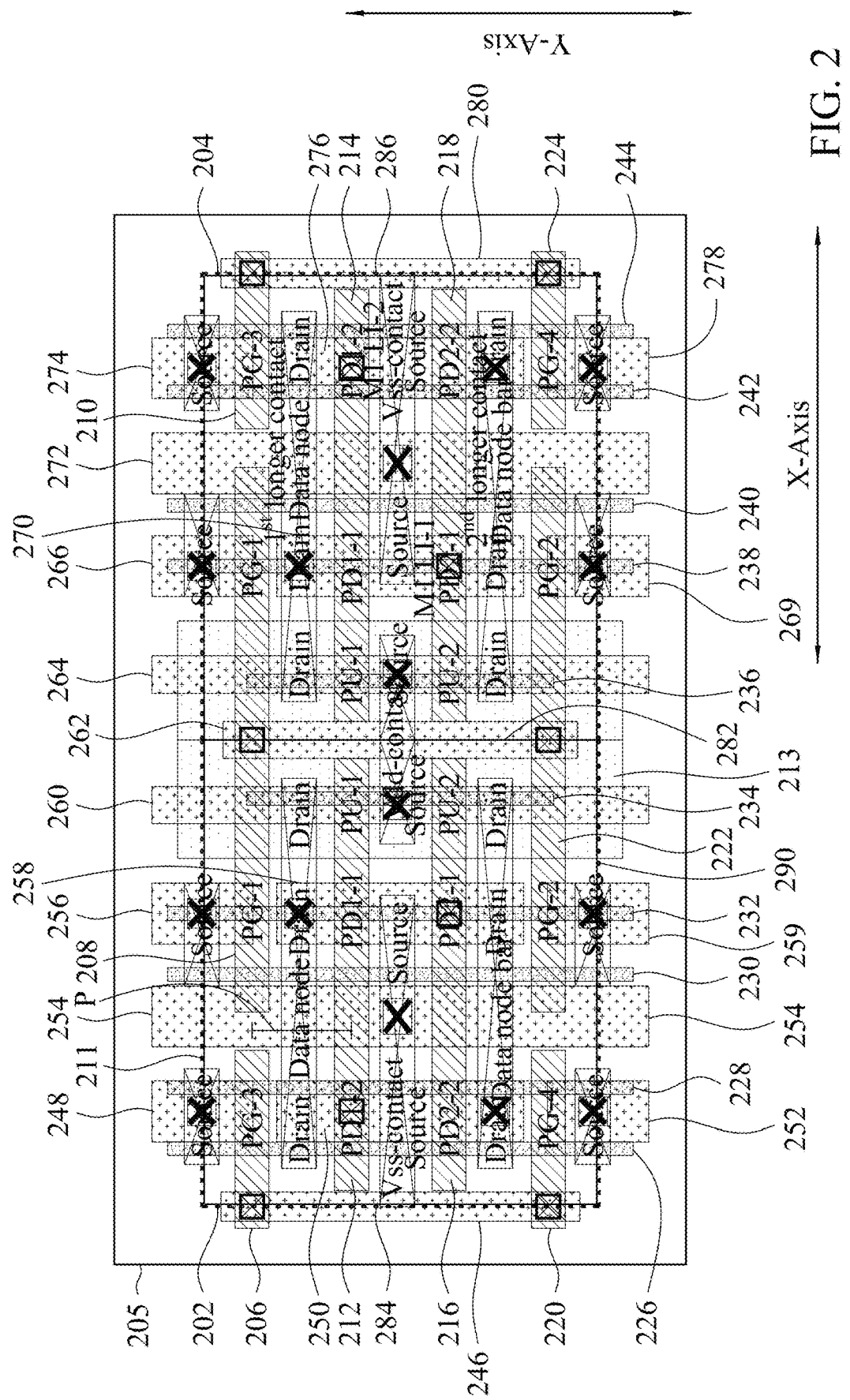
FIG. 2 is a top view of a front-end-of-line (FEOL) layout of a pair of DP SRAM cells, in accordance with some embodiments.
Figure 3:
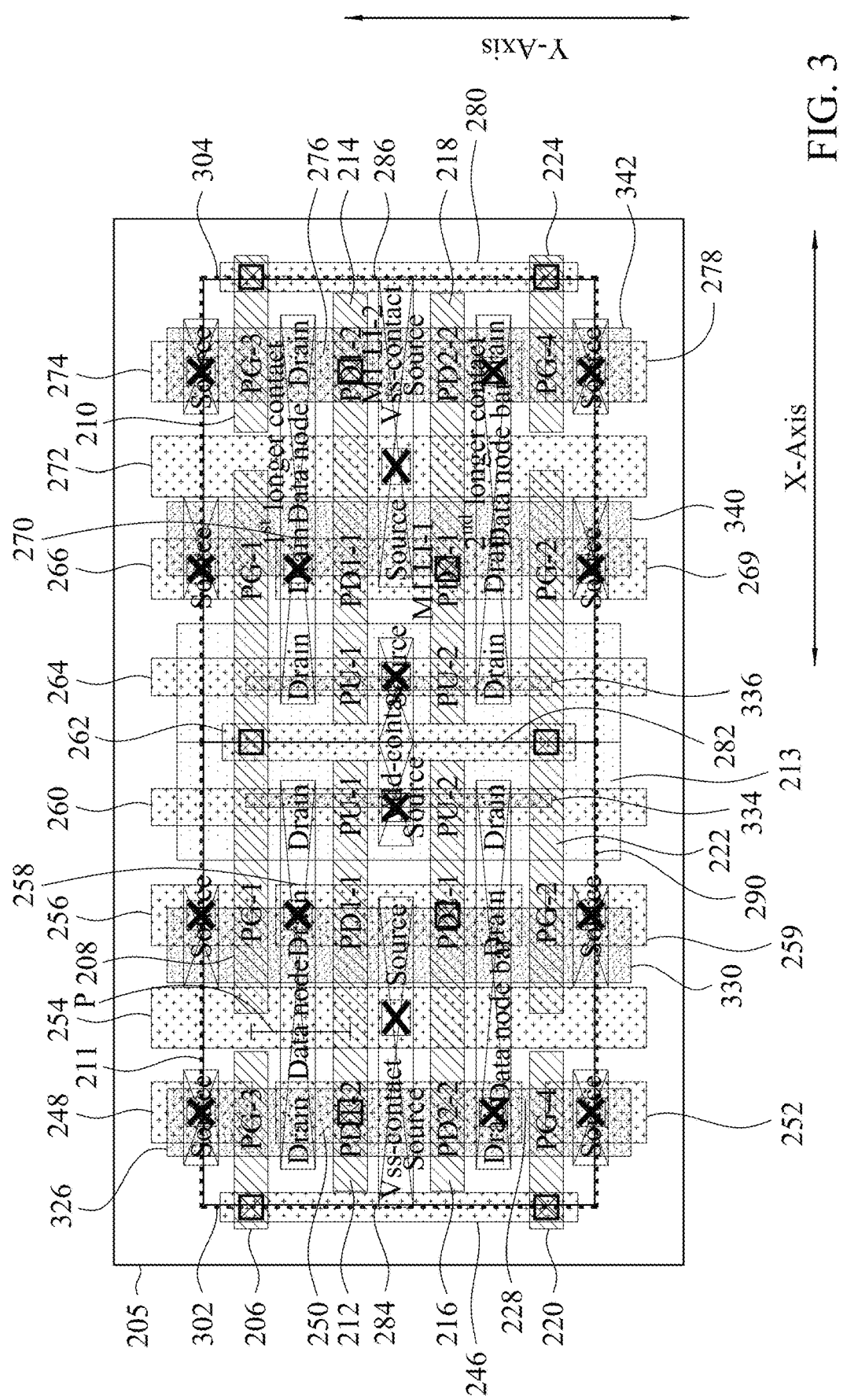
FIG. 3 is a top view of a FEOL layout of a pair of DP SRAM cells, in accordance with some embodiments.
Figure 4:
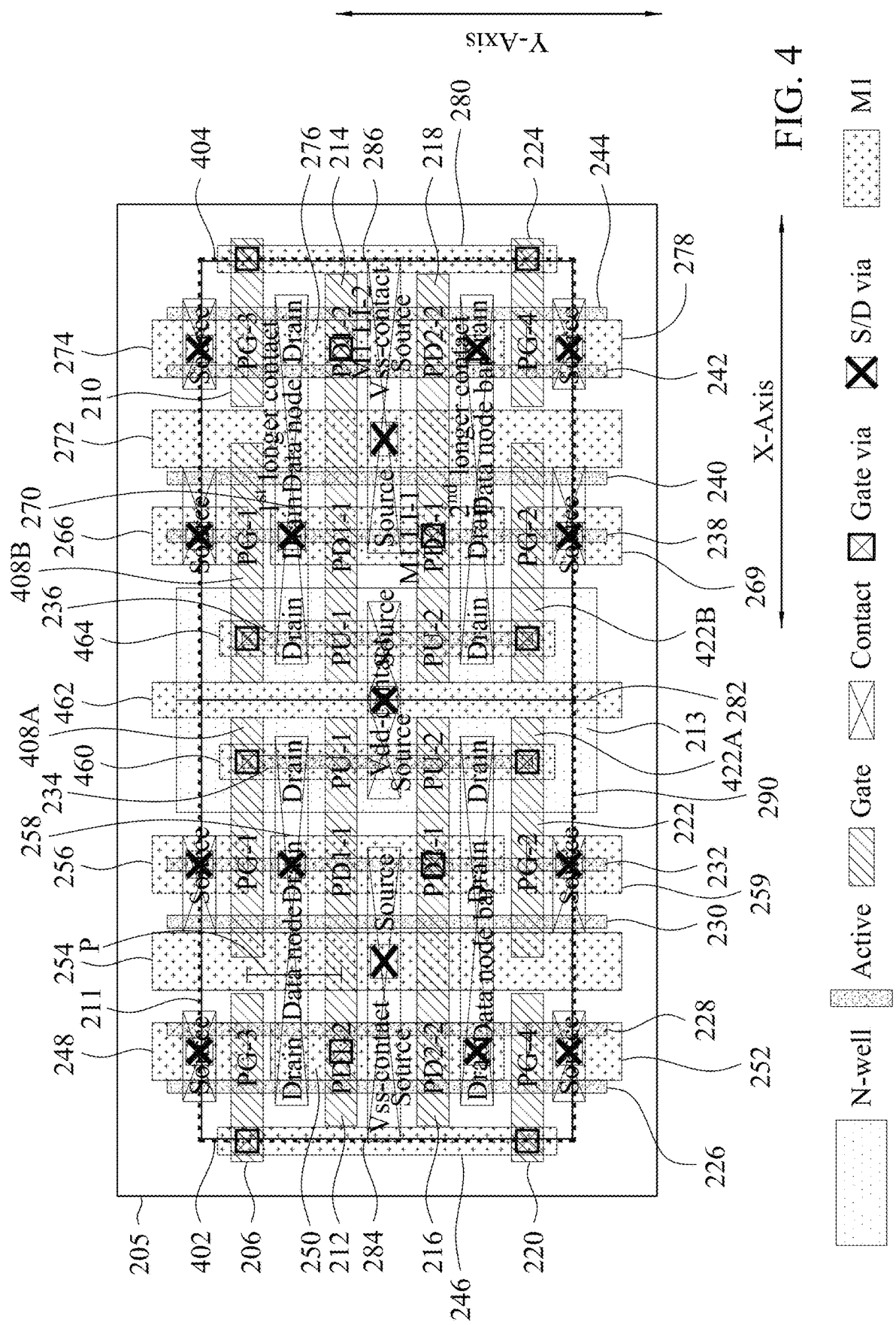
FIG. 4 is a top view of a FEOL layout of a pair of DP SRAM cells, in accordance with some embodiments.
Figure 5:
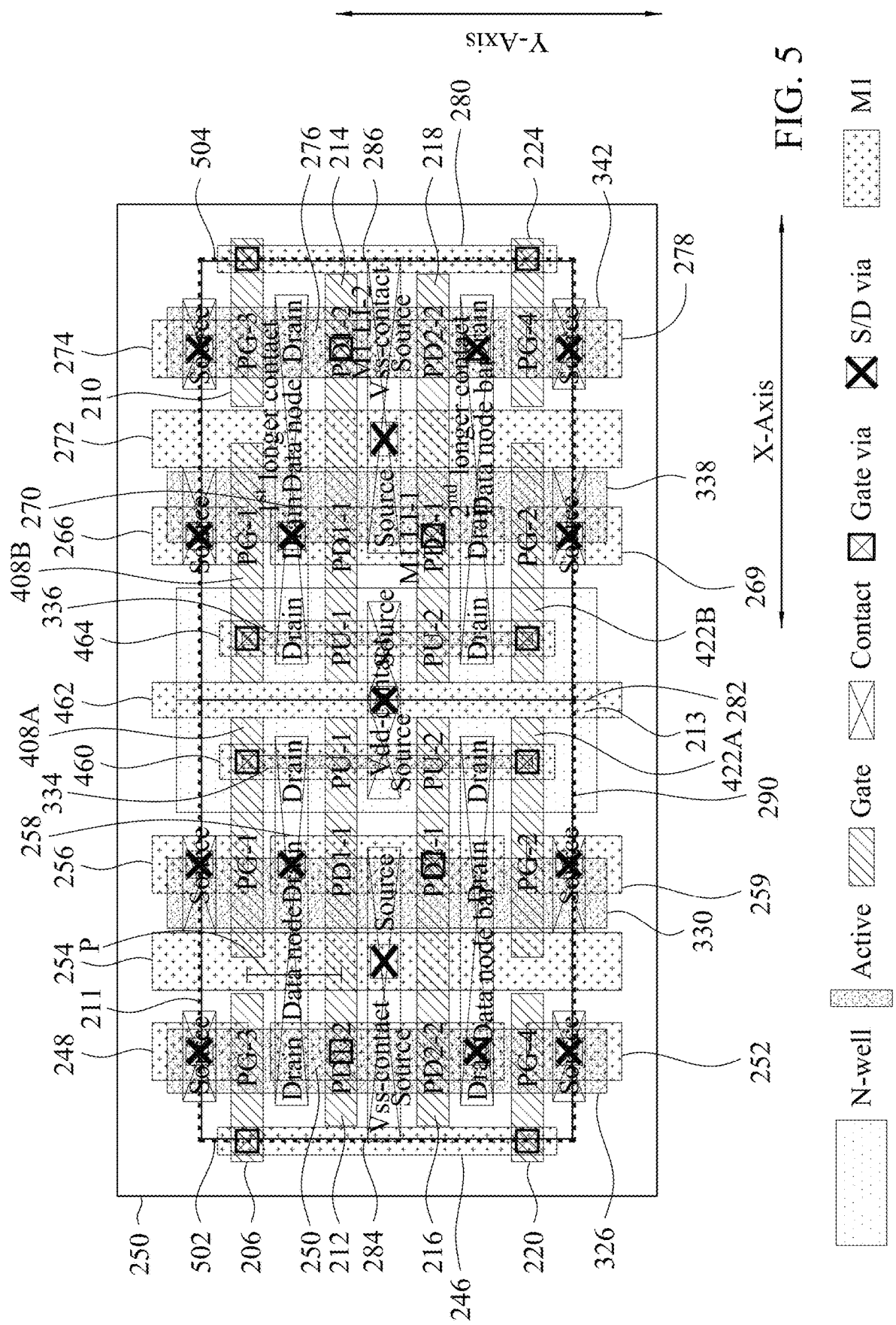
FIG. 5 is a top view of a FEOL layout of a pair of DP SRAM cells, in accordance with some embodiments.
Figure 11:
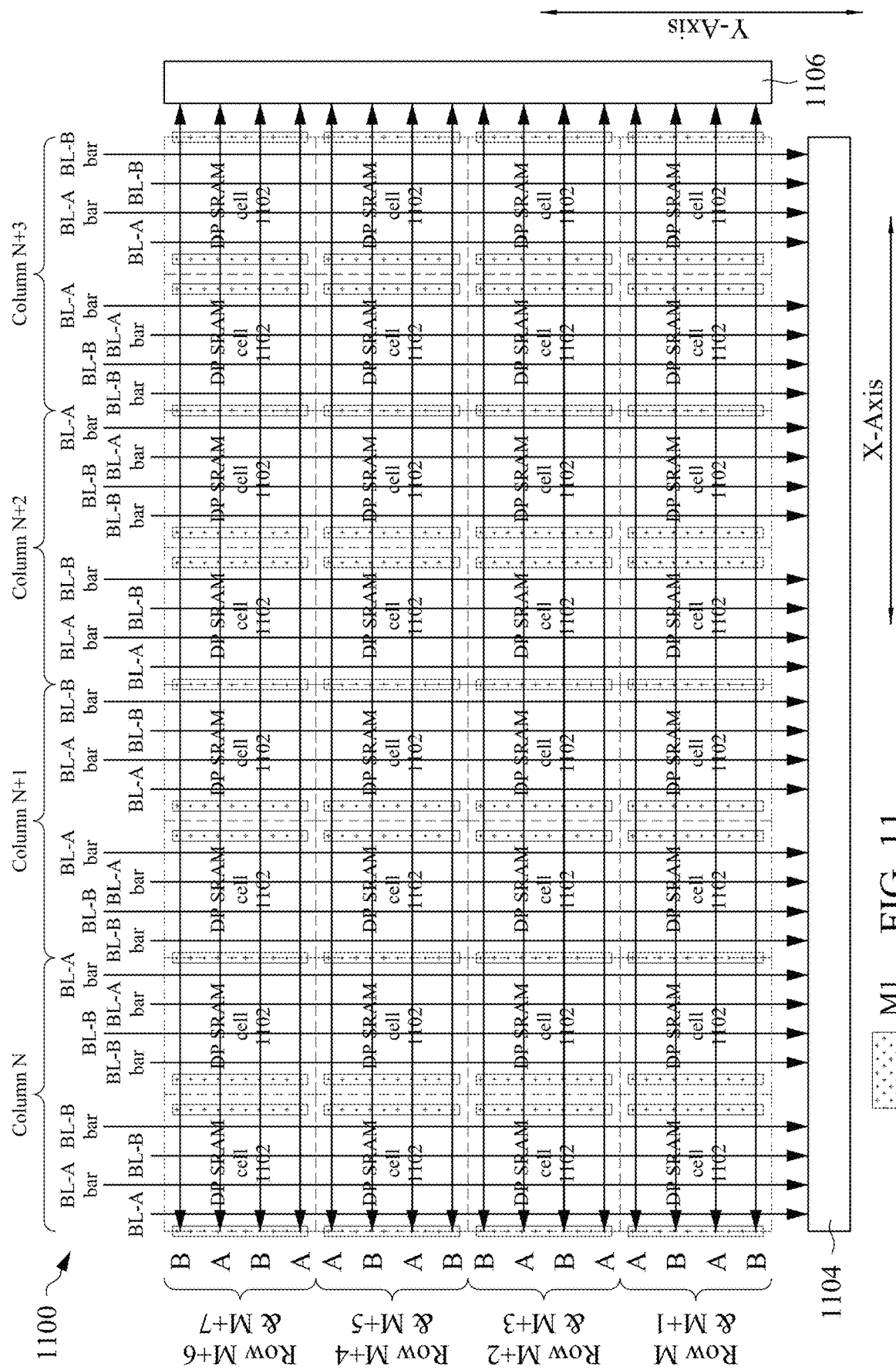
FIG. 11 is a block diagram of a memory circuit including an array of DP SRAM cells, in accordance with some embodiments.
Figure 12:
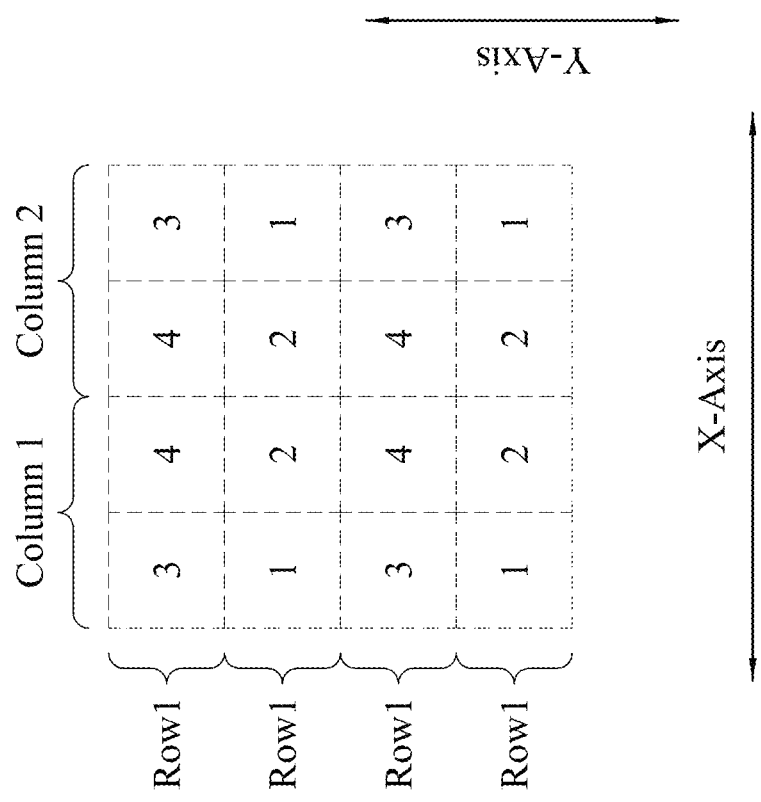
FIG. 12 is a block diagram illustrating an arrangement of DP SRAM cells, in accordance with some embodiments.
Figure 13:
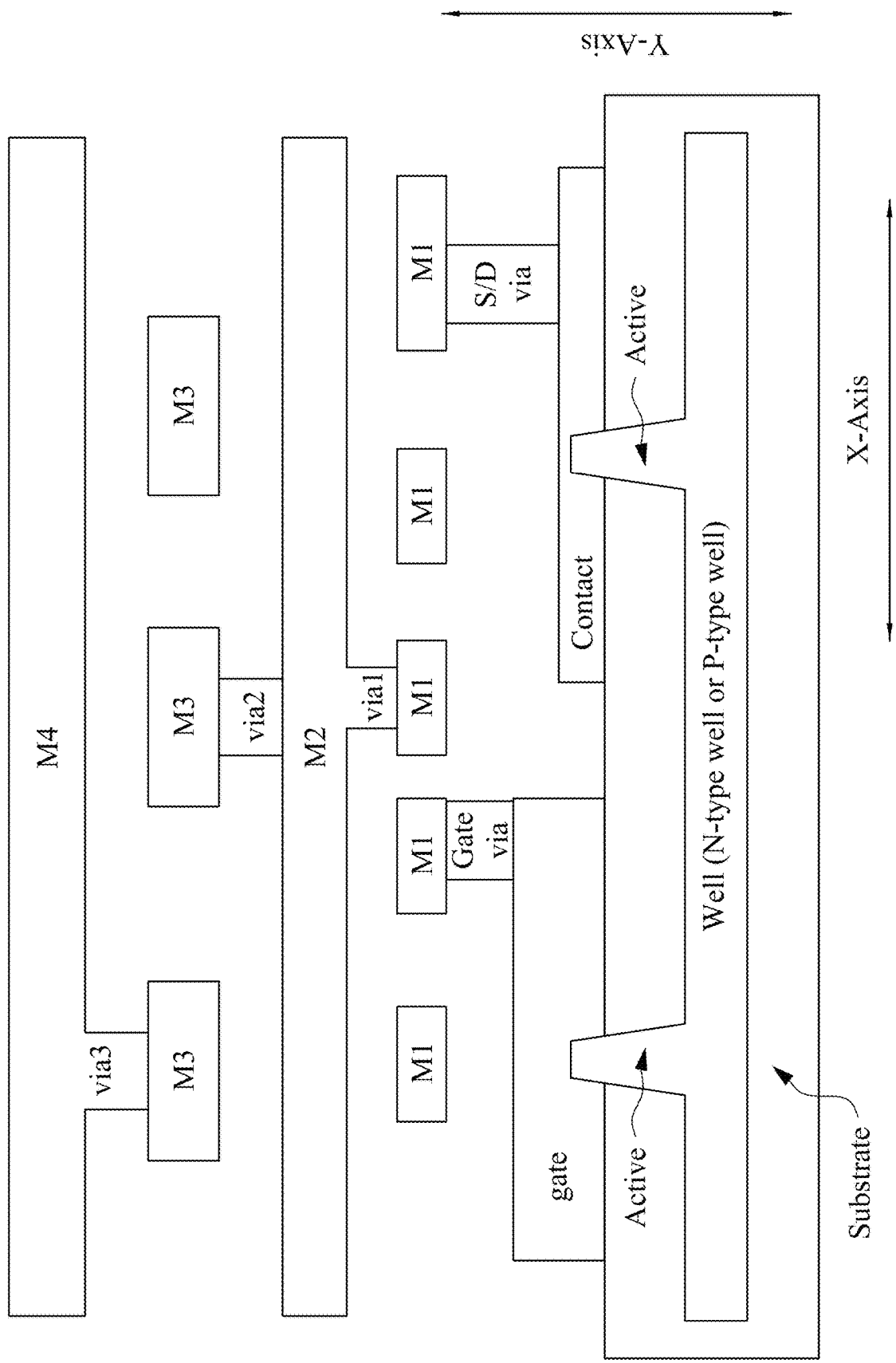
FIG. 13 is a cross sectional view illustrating the organization of a semiconductor device, in accordance with some embodiments.

DP SRAM cell 100 is configured in accordance with one or more of the embodiments discussed below with respect to FIGS. 2-13. FIGS. 2 and 3 depict FEOL features corresponding to embodiments in which two instances of DP SRAM cell 100 share a word line landing pad; FIGS. 4 and 5 depict FEOL features corresponding to embodiments in which two instances of DP SRAM cell 100 share a power voltage node conductor; FIGS. 6-10 depict conductive structures, e.g., back-end-of-line (BEOL) features, corresponding to embodiments including two instances of DP SRAM cell 100; FIGS. 11 and 12 depict embodiments in which a memory circuit includes an array of DP SRAM cells 100; and FIG. 13 depicts a cross-section of a semiconductor device arranged in accordance with the various embodiments.

Each of FIGS. 3-13 represents both an IC layout diagram and a semiconductor device manufactured based on the corresponding IC layout diagram. The various features of the IC layout diagram are usable in a manufacturing process, e.g., an IC manufacturing system 1700 and IC manufacturing flow associated therewith discussed below with respect to FIG. 17, to at least partly define the various corresponding features of the resultant semiconductor device.

In the various embodiments, NMOSFETs and PMOSFETs are formed by any proper technology. In some embodiments, the NMOSFETs and PMOSFETs are planar MOSFETs, e.g., formed using high-k dielectric/metal gate technology. In some embodiments, the various NMOSFETs and PMOSFETs include fin field effect transistors (FinFETs). In some embodiments, the FinFETs are formed by a process including depositing a dielectric material layer on the semiconductor substrate, etching the dielectric material layer to form openings thereof, growing an epitaxial layer of a semiconductor material (such as silicon) on the semiconductor substrate within the openings to form fin active regions. In some embodiments, the substrate has a silicon-on-insulator (SOI) structure. The various FinFETs may also include strained features for enhanced mobility and device performance. For example, the pFinFETs may include epitaxial layers of silicon germanium on a silicon substrate. In some embodiments, instances of DP SRAM cell 100 include additional devices such as additional PD devices and PG devices.

In some embodiments, the various NMOSFETs and PMOSFETs are gate-all-around (GAA) field effect transistors. A GAA transistor is fabricated on a substrate using nanowire, nano-sheet, or similar technology. In some embodiments, the substrate is a semiconductor substrate (e.g., Si, SiGe, or SiGeB). In some embodiments, the substrate has a SOI structure. In some embodiments, the substrate is a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof. Various doped regions are formed in the substrate depending on design requirements (e.g., p-type substrate or n-type substrate). In some embodiments, the doped regions are doped with p-type or n-type dopants. For example, the doped regions may be doped with p-type dopants, such as boron or BF2; n-type dopants, such as phosphorus or arsenic; and/or combinations thereof. The doped regions may be configured for an n-type GAA transistor, or alternatively configured for a p-type GAA transistor. In some embodiments, isolation regions are formed in the substrate to isolate the various doped regions.

In the various figures and discussion below, first, second, third, and fourth metal layers corresponding to conductive structures, e.g., BEOL features, are also referred to as metal layers M1, M2, M3, and M4, respectively. In some embodiments, the first, second, third, and fourth metal layers corresponding to the conductive structures discussed below are otherwise referenced, e.g., as metal layers M2, M3, M4, and M5, respectively.

FIG. 2 is a top view of a FEOL layout of a pair of DP SRAM cells 202, 204 including a conductive structure of the DP SRAM cells 202, 204 having various M1 conductors. In the embodiment depicted in FIG. 2, each of the DP SRAM cells 202, 204 is an example of the DP SRAM cell 100 shown in FIG. 1A, FIG. 1B in which the various transistors are configured as FinFETs.

A first direction is defined as parallel to the X-axis and a second direction is defined parallel to the Y-axis. Thus, the first direction is perpendicular to the second direction. In FIG. 2, DP SRAM cells 202, 204 are mirror images of one another with respect to a line extending in the second direction at a midpoint along the X-axis.

Transistors of the DP SRAM cells 202, 204 in the FEOL layout of the DP SRAM cells 202, 204 are formed in a semiconductor substrate 205, and include gate electrodes 206, 208, 210, 212, 214, 216, 218, 220, 222, 224 formed over the semiconductor substrate 205, as explained in further detail below. More specifically, transistors of the DP SRAM cells 202, 204 are formed by active regions 226, 228, 230, 232, 234, 236, 238, 240, 242, 244 in the semiconductor substrate 205 in combination with the gate electrodes 206, 208, 210, 212, 214, 216, 218, 220, 222, 224 formed on the active regions 226, 228, 230, 232, 234, 236, 238, 240, 242, 244, as explained in further detail below. In this embodiment, the active regions 226, 228, 230, 232, 234, 236, 238, 240, 242, 244 are fabricated so that the transistors are FinFETs.

Gate electrode 206 in DP SRAM cell 202 corresponds with gate electrode 210 in DP SRAM cell 204. A left half of gate electrode 208 in DP SRAM cell 202 corresponds with a right half of gate electrode 208 in DP SRAM cell 204. Gate electrode 212 in DP SRAM cell 202 corresponds with gate electrode 214 in DP SRAM cell 204. Gate electrode 216 in DP SRAM cell 202 corresponds with gate electrode 218 in DP SRAM cell 204. Gate electrode 220 in DP SRAM cell 202 corresponds with gate electrode 224 in DP SRAM cell 204. A left half of gate electrode 222 in DP SRAM cell 202 corresponds with a right half of gate electrode 222 in DP SRAM cell 204.

Active regions 226, 228, 230, 232, 234, 236, 238, 240, 242, 244 each define a long axis that extends parallel to the Y-axis. Active regions 226, 228, 230, 232, 234, 236, 238, 240, 242, 244 are provided in the listed order with respect to the X-Axis from left to right in FIG. 2. Active regions 226, 228, 230, 232, 234, 236, 238, 240, 242, 244 are aligned with respect to the Y-axis and separated with respect to the X-axis. Active regions 226, 228, 230, 232, 234, are located in DP SRAM cell 202, and active regions 236, 238, 240, 242, 244 are located in DP SRAM cell 204. Active regions 226, 228, 230, 232, 238, 240, 242, 244 have n-type doping in order to form NMOSFETs. Active regions 234, 236 are formed in an N-Well 213 in semiconductor substrate 205. Active regions 234, 236 have p-type doping in order to form PMOSFETs. Active region 234 is located in the DP SRAM cell 202 and active region 236 is located in the DP SRAM cell 204. Active regions 234, 236 are shorter with respect to the X-axis than active regions 226, 228, 230, 232, 238, 240, 242, 244. Active regions 226, 228, 230, 232, 234, 236, 238, 240, 242, 244 are configured to form FinFETs.

Active region 226 in DP SRAM cell 202 corresponds with active region 244 in DP SRAM cell 204. Active region 228 in DP SRAM cell 202 corresponds with active region 242 in DP SRAM cell 204. Active region 230 in DP SRAM cell 202 corresponds with active region 240 in DP SRAM cell 204. Active region 232 in DP SRAM cell 202 corresponds with active region 238 in DP SRAM cell 204. Active region 234 in DP SRAM cell 202 corresponds with active region 236 in DP SRAM cell 204.

Gate electrodes 206, 208, 210, 212, 214, 216, 218, 220, 222, 224 are each formed in a gate layer that is formed over the semiconductor substrate 205. Each of the gate electrodes 206, 208, 210, 212, 214, 216, 218, 220, 222, 224 has a long axis that extends parallel to the X-axis. Gate electrodes 206, 208, 210 are aligned with respect to the Y-axis and separated by a pitch P (only shown once in FIG. 2 for the sake of clarity) from adjacent gate electrodes 212, 214 with respect to the Y-axis. Gate electrode 206 is in DP SRAM cell 202 and gate electrode 210 is in DP SRAM cell 204. A left half of gate electrode 208 is in DP SRAM 202 and a right half of gate electrode 208 is in DP SRAM cell 204 where the gate electrode 208 is between gate electrodes 206, 210 with respect to the X-axis. A separation of gate electrodes 206, 208, 210 to a top boundary 211 of D is half the gate pitch (½*P).

Below gate electrode 206, 208, 210 are adjacent gate electrodes 212, 214. Gate electrode 212 is in the DP SRAM cell 202. Gate electrodes 212, 214 are aligned with respect to the Y-axis. Separated by the pitch P and below gate electrodes 212, 214 with respect to the Y-axis are gate electrodes 220, 222, 224.

Below gate electrodes 216, 218 are adjacent gate electrodes 220, 222, 224. Gate electrodes 220, 222, 224 are aligned with respect to the Y-axis and separated by the pitch P from adjacent gate electrodes 216, 218 with respect to the Y-axis. Gate electrode 220 is in DP SRAM cell 202 and gate electrode 224 is in DP SRAM cell 204. A left half of gate electrode 222 is in DP SRAM 202 and a right half of gate electrode 222 is in DP SRAM cell 204, where the gate electrode 222 is between gate electrodes 220, 224 with respect to the X-axis. A separation of gate electrodes 206, 208, 210 to a bottom boundary 290 of DP SRAM cells 202, 204 is half the gate pitch (½*P). Accordingly, with respect to the Y-axis, DP SRAM cells 202, 204 have a height equal to four times the gate pitch (i.e., 4*P).

Conductors 246, 248, 250, 252, 254, 256, 258, 259, 260, 262, 264, 266, 269, 270, 272, 274, 276, 278, 280 are provided in metal layer M1, which is above the semiconductor substrate 205. Each of the conductors 246, 248, 250, 252, 254, 256, 258, 259, 260, 262, 264, 266, 269, 270, 272, 274, 276, 278, 280 defines a long axis that extends parallel to the Y-axis. The conductors 246, 248, 250, 252, 254, 256, 258, 259, 260, 262, 264, 266, 269, 270, 272, 274, 276, 278, 280 are at least partially aligned with respect to the Y-axis. Conductors 246, 248, 250, 252, 254, 256, 258, 259 260 are located in the DP SRAM cell 202 and conductors 264, 266, 269, 270, 272, 274, 276, 278, 280 are in DP SRAM cell 204. Conductor 262 is shared by the DP SRAM cells 202, 204.

Conductor 246 in DP SRAM cell 202 corresponds with conductor 280 in DP SRAM cell 204. Conductor 248 in DP SRAM cell 202 corresponds with conductor 274 in DP SRAM cell 204. Conductor 250 in DP SRAM cell 202 corresponds with conductor 276 in DP SRAM cell 204. Conductor 252 in DP SRAM cell 202 corresponds with conductor 278 in DP SRAM cell 204. Conductor 254 in DP SRAM cell 202 corresponds with conductor 272 in DP SRAM cell 204. Conductor 256 in DP SRAM cell 202 corresponds with conductor 266 in DP SRAM cell 204. Conductor 258 in DP SRAM cell 202 corresponds with conductor 270 in DP SRAM cell 204. Conductor 259 in DP SRAM cell 202 corresponds with conductor 269 in DP SRAM cell 204. Conductor 260 in DP SRAM cell 202 corresponds with conductor 264 in DP SRAM cell 204.

A detailed explanation is now provided for DP SRAM cell 202 while an explanation for DP SRAM cell 204 is omitted for the sake of brevity. It should be understood that DP SRAM cell 204 is the same as DP SRAM cell 204 except that DP SRAM cell 204 is a mirror image of DP SRAM cell 202 with respect to the Y-axis. The discussion above recites how the components in the DP SRAM cell 202 correspond with the components in DP SRAM cell 204. The discussion below refers to various contacts and vias that are not individually labeled for the purpose of clarity.

Gate electrode 206 is a gate of PG-3 in DP SRAM cell 202. Portions of active regions 226, 228 above the gate electrode 206 with respect to the X-axis are configured as the source of PG-3. Portions of active regions 226, 228 below the gate electrode 206 and above the gate electrode 212 are configured as the shared drain of PG-3 and PD1-2. The leftmost portion of gate electrode 212 is a gate of PD1-2. Portions of active regions 226, 228 below gate electrode 212 and above gate electrode 216 are configured as a shared source of PD1-2 and PD2-2. The leftmost portion of gate electrode 216 is a gate of PD2-2. Portions of active regions 226, 228 below gate electrode 216 and above gate electrode 220 are configured as a shared drain of PD2-2 and PG-4. Gate electrode 220 is a gate of PG-4. Portions of active regions 226, 228 below the gate electrode 220 are configured as a source of PG-4.

The left half of gate electrode 208 is a gate of PG-1. Portions of active regions 230, 232 above the left half of gate electrode 208 are configured as a source of PG-1. Portions of active regions 230, 232 below the left half of gate electrode 208 and above the gate electrode 212 are configured as a shared drain of PG-1, PD1-1. The middle portion of gate electrode 212 is a gate of PD1-1. Portions of active regions 230, 232 below the gate electrode 212 and above the gate electrode 216 are configured as a shared source of PD-1, PD-2. The middle portion of gate electrode 216 is a gate of PD2-2. Portions of active regions 230, 232 below gate electrode 216 and above the left half of gate electrode 222 are configured as a shared drain of PD2-1, PG-2. The left half of gate electrode 222 is a gate of PG-2. Portions of active regions 230, 232 below the left half of the gate electrode 222 are configured as a source of PG-2.

The portion of active region 234 above the right portion of gate electrode 212 is configured as a drain of PU-1. The right portion of gate electrode 212 is a gate of PU-1. The portion of active region 234 below the right portion of gate electrode 212 and above the right portion of gate electrode 216 is configured as a shared source of PU-1, PU-2. The right portion of gate electrode 216 is a gate of PU-2. The portion of active region 234 below the right portion of gate electrode 216 is configured as a drain of PU-2.

Conductor 246 extends along a leftmost boundary 284 of DP SRAM cell 202. Conductor 246 is a word line landing pad of the word line WL-B. The conductor 246 is coupled to the word line WL-B. Note that another DP SRAM cell like the DP SRAM cell 202 but that is a mirror image along the left most boundary (which is parallel to the Y-axis) can be placed next to DP SRAM cell 202 and the cells would share the conductor 246 as a word line landing pad for word line WL-B. Word line WL-B is located in a metal layer above metal layer M1, as described in further detail below. As shown, a gate via in a gate via layer connects the gate electrode 206 (and thus the gate of PG-3) to the conductor 246. The gate via layer is a via layer above the gate electrode layer and below metal layer M1. A gate via in the gate via layer also connects the gate electrode (and thus the gate of PG-4) to the conductor 246.

Conductor 248 is a bit line landing pad of bit line BL-B. Conductor 248 is coupled to bit line BL-B, as described in further detail below. A contact in a metal layer, e.g., a metal-like defined (MD) layer, is connected to the portions of the active regions 226, 228 that are the source of PG-3. The MD or similar layer is provided directly above the semiconductor substrate. A Source/Drain (S/D) via in a drain via layer connects the contact in the MD layer to the conductor 248. The drain via layer is an interconnect layer above the MD or similar layer and below metal layer M1.

Conductor 250 is a local interconnect (M1 LI-2). A gate via connects the gate electrode 212 (and thus the gates of PU-1, PD1-1, PD1-2) to the conductor 250. A contact is connected to the portions of active regions 226, 228, 230, 232, 234 that are configured as the drains of PD2-2, PD2-1, PU-2. A via connects this contact to the conductor 250.

Conductor 252 is a bit line landing pad for bit line BL-B bar. Conductor 252 is coupled to bit line BL-B bar, as described in further detail below. A contact is connected to the portions of the active regions 226, 228 that are configured as the source of PG-4. A S/D via connects the contact to the conductor 252.

Conductor 254 is a reference voltage conductor that is configured to receive the reference voltage VSS. In some embodiments, conductor 254 is connected to the reference voltage node 103 (not shown). A contact is connected to the portions of the active regions 226, 228, 230, 232 that are configured as the sources of PD1-1, PD2-1, PD2-1, P2-2. A S/D via connects this contact to the conductor 254.

Conductor 256 is a bit line landing pad for bit line BL-A. Conductor 256 is coupled to bit line BL-A, as described in further detail below. A contact is connected to the portions of the active regions 230, 232 that are configured as the source of PG-1. A S/D via connects the contact to the conductor 256.

Conductor 258 is a local interconnect (M1 LI-1). A gate via connects the gate electrode 216 (and thus the gates of PU-2, PD2-1, PD2-2) to the conductor 258. A contact is connected to the portions of active regions 226, 228, 230, 232, 234 that are configured as the drains of PD1-1, PD1-2, PU-1. A via connects this contact to the conductor 258.

Conductor 259 is a bit line landing pad for bit line BL-A bar. Conductor 259 is coupled to bit line BL-A bar, as described in further detail below. A contact is connected to the portions of the active regions 230, 232 that are configured as the source of PG-2. A S/D via connects this contact to the conductor 258.

Conductor 260 is a power source voltage conductor that is configured to receive the power source voltage VDD. In some embodiments, conductor 260 is connected to the power source voltage node 101 (not shown). A contact is connected to portions of the active regions 234, 236 that are configured as the source of PU-1, PU-2 of both the DP SRAM cell 202 and the DP SRAM cell 204. A S/D via connects this contact to the conductor 260. A S/D via connects this contact to the conductor 260.

Conductor 262 extends along a rightmost boundary 282 of DP SRAM cell 202. Conductor 262 is a word line landing pad the word line WL-A. The conductor 262 is coupled to the word line WL-A. Note that DP SRAM cell 204 is a mirror image along the rightmost boundary 282 and placed next to DP SRAM cell 202 such that the cells share the conductor 262 as a word line landing pad for word line WL-A. As shown, a gate via connects the gate electrode 208 (and thus the gate of PG-1) to the conductor 262. A gate via also connects the gate electrode 222 (and thus the gate of PG-3) to the conductor 262.

FIG. 3 is a top view of a FEOL of a pair of DP SRAM cells 302, 304 and a conductive structure of the DP SRAM cells 302, 304 including various conductors in the M1 metal layer. In the embodiment depicted in FIG. 3, each of the DP SRAM cells 302, 304 is an example of the DP SRAM cell 100 shown in FIG. 1A, FIG. 1B with DP SRAM cells 302, 304 being mirror images of one another with respect to the Y-axis.

DP SRAM cells 302, 304 are the same as DP SRAM cells 202, 204 in FIG. 2 respectively, expect for the active regions 326, 330, 334, 336, 338, 342. In this embodiment, the active regions 326, 330, 334, 336, 338, 342 are configured such that the transistors are GAA transistors.

Active region 326 corresponds to active regions 226, 228 in FIG. 2 and is connected in a similar manner. Active region 330 corresponds to active regions 230, 232 in FIG. 2 and is connected in a similar manner. Active region 334 corresponds to active region 234 in FIG. 2 and is connected in a similar manner. Active region 336 corresponds to active region 236 in FIG. 2 and is connected in a similar manner. Active region 338 corresponds to active regions 238, 240 in FIG. 2 and is connected in a similar manner. Active region 342 corresponds to active regions 242, 244 in FIG. 2 and is connected in a similar manner.

FIG. 4 is a top view of a FEOL of a pair of DP SRAM cells 402, 404 and a conductive structure of the DP SRAM cells 402, 404 including various conductors in the M1 metal layer.

Each of the DP SRAM cells 402, 404 is an example of the DP SRAM cell 100 shown in FIG. 1A, FIG. 1B. In FIG. 4, DP SRAM cells 402, 404 are mirror images of one another with respect to the Y-axis.

DP SRAM cells 402, 404 are the same as DP SRAM cells 202, 204 in FIG. 2 respectively, except that gate electrodes 408A and 408B replace gate electrode 208, gate electrodes 422A and 422B replace gate electrode 222, and conductors 460, 462, 464 replace conductors 260, 262, 264 in the M1 metal layer.

DP SRAM cells 402, 404 include conductors 460, 462, 464 instead of conductors 260, 262, 264 in FIG. 2. Conductor 464 in DP SRAM cell 404 corresponds with conductor 460 in DP SRAM cell 402. Configuration of conductor 460 and gate electrodes 408A and 422A is explained herein and the explanation of conductor 464 and gate electrodes 408B and 422B is omitted because the configuration of DP SRAM cell 404 is the same as DP SRAM cell 402 except that DP SRAM cell 404 is a mirror image of DP SRAM cell 402 with respect to the X-axis.

Conductor 462 has a long axis that extends parallel to the Y-axis. Conductor 462 is positioned along the inner boundary 282 of the DP SRAM cells 402, 404. Conductor 462 is a power source voltage conductor that is configured to receive the power source voltage VDD. In some embodiments, conductor 462 is connected to the power source voltage node 101 (not shown). A contact is connected to portions of the active regions 234, 236 that are configured as the source of PU-1, PU-2 of both the DP SRAM cell 402 and the DP SRAM cell 404. A S/D via connects this contact to the conductor 462. Note that DP SRAM cell 404 is a mirror image along the rightmost boundary 282 and placed next to DP SRAM cell 402 such that the cells share the conductor 462 as a landing pad for the power source voltage VDD.

Conductor 460 has a long axis that extends parallel to the Y-axis. Conductor 460 is between conductor 462 and conductors 256, 258, 259. In some embodiments, conductor 460 is a word line landing pad of the word line WL-A, and the conductor 460 is coupled to the word line WL-A. As shown, a gate via connects the gate electrode 408A (and thus the gate of PG-1) to the conductor 460. A gate via also connects the gate electrode 422 (and thus the gate of PG-3) to the conductor 460.

Compared to the pair of DP SRAM cells 202, 204, because the gates of PG-1 and PG-3 of DP SRAM 402 are coupled to conductor 460, and the gates of PG-1 and PG-3 of DP SRAM 404 are separately coupled to conductor 464, the pair of DP SRAM cells 402, 404 is capable of being independently controlled, e.g., as discussed below with respect to FIGS. 9 and 10.

FIG. 5 is a top view of a FEOL of a pair of DP SRAM cells 502, 504 and a conductive structure of the DP SRAM cells 502, 504 including various conductors in an M1 metal layer.

Each of the DP SRAM cells 502, 504 is an example of the DP SRAM cell 100 shown in FIG. 1A, FIG. 1B. In FIG. 5, DP SRAM cells 502, 504 are mirror images of one another with respect to the Y-axis.

DP SRAM cells 502, 504 are the same as DP SRAM cells 402, 404 depicted in FIG. 4 except that DP SRAM cells 502, 504 include the active regions 326, 330, 334, 336, 338, 342 configured such that the transistors are GAA transistors, as described above with respect to FIG. 3.

By the configurations discussed above, each pair of DP SRAM cells 202/204, 302/304, 402/404, and 502/504 includes symmetrical instances of DP SRAM 100 and is thereby capable of having reduced effects from process and temperature variations compared to approaches that do not include symmetrical instances of DP SRAM cells. Further, by the configurations discussed above, each pair of DP SRAM cells 202/204, 302/304, 402/404, and 502/504 enables electrical connection configurations whereby the additional benefits discussed below are capable of being realized.

Figure 6:
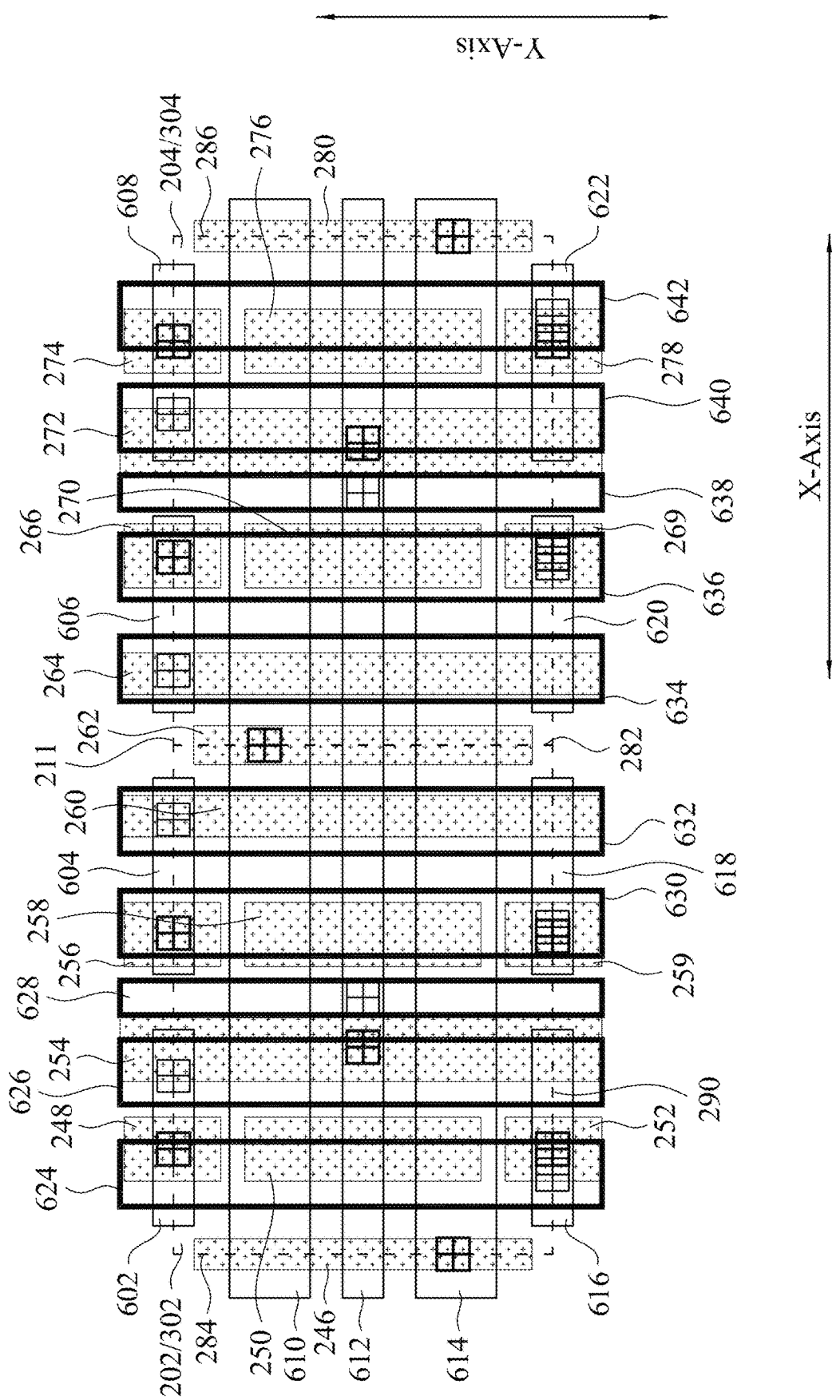
FIG. 6 is a top view of a layout of a conductive structure of DP SRAM cells, in accordance with some embodiments.

FIG. 6 is a top view of a conductive structure located in the M1 metal layer, the M2 metal layer, and the M3 metal layer of the DP SRAM cells 202, 204 or 302, 304.

Conductors 246, 248, 250, 252, 254, 256, 258, 259, 260, 262, 264, 266, 269, 270, 272, 274, 276, 278, 280 are provided in the metal layer M1 as discussed above with respect to FIGS. 2 and 3. Metal layer M2 is above metal layer M1 with respect to a Z-axis (not shown but comes into and out of the page in FIG. 6). Metal layer M3 is above metal layer M2 with respect to the Z-axis.

Conductors 602, 604, 606, 608, 610, 612, 614, 616, 618, 620, 622 are each located in the M2 metal layer. Conductors 602, 604, 606, 608, 610, 612, 614, 616, 618, 620, 622 each define a long axis that is parallel to the X-axis.

Conductors 602, 604, 606, 608 each extend along the upper boundary 211 of the DP SRAM cells 202/302, 204/304 and are aligned with respect to the Y-axis and separated with respect to the X-axis. Conductors 602, 604 are provided in the DP SRAM cell 202/302 and conductors 606, 608 are provided in the DP SRAM cell 204/304.

Conductor 602 is the leftmost conductor and is a bit line landing pad for bit line BL-B. A via in a via layer 1 connects the conductor 602 to the conductor 248 in metal layer M1. Via layer 1 is a via layer between metal layer M1 and metal layer M2 with respect to the Z-axis. Conductor 608 in DP SRAM cell 204/304 corresponds to conductor 602 in DP SRAM cell 202/302. Conductor 608 is the rightmost conductor and is a bit line landing pad for bit line BL-B. A via in via layer 1 connects the conductor 608 to the conductor 274 in metal layer M1.

Conductor 604 is a bit line landing pad for bit line BL-A. A via in via layer 1 connects the conductor 604 to the conductor 256 in metal layer M1. Conductor 606 in DP SRAM cell 204/304 corresponds to conductor 604 in DP SRAM cell 202/302. Conductor 606 is a bit line landing pad for bit line BL-A. A via in via layer 1 connects the conductor 606 to the conductor 266 in metal layer M1.

Conductor 610 extends across the DP SRAM cells 202/302, 204/304. Conductor 610 is between conductors 602, 604, 606, 608 and conductor 612 with respect to the Y-axis. Conductor 610 is the word line WL-A. A via in via layer 1 connects the conductor 610 to the conductor 262.

Conductor 612 extends across the DP SRAM cells 202/302, 204/304. Conductor 610 is between conductor 610 and conductor 614 with respect to the Y-axis. Conductor 612 is a reference voltage conductor and is configured to receive the reference voltage VSS. A via in via layer 1 connects the conductor 612 to the conductor 254 of DP SRAM cell 202/302 in metal layer M1. A via in via layer 1 connects the conductor 612 to the corresponding conductor 272 of DP SRAM cell 204/304 in metal layer M1.

Conductor 614 extends across the DP SRAM cells 202/302, 204/304. Conductor 614 is between conductor 612 and conductors 616, 618, 620, 622 with respect to the Y-axis. Conductor 614 is the word line WL-B. A via in via layer 1 connects the conductor 614 to the conductor 246 of DP SRAM cell 202/302 in metal layer M1. A via in via layer 1 connects the conductor 614 to the corresponding conductor 280 of DP SRAM cell 204/304 in metal layer M1.

Conductors 616, 618, 620, 622 each extend along the lower boundary 290 of the DP SRAM cells 202/302, 204/304 and are aligned with respect to the Y-axis and separated with respect to the X-axis. Conductors 616, 618 are provided in the DP SRAM cell 202/302 and conductors 620, 622 are provided in the DP SRAM cell 204/304.

Conductor 616 is the leftmost conductor and is a bit line landing pad for bit line BL-B bar. A via in via layer 1 connects the conductor 616 to the conductor 252 in metal layer M1. Conductor 622 in DP SRAM cell 204/304 corresponds to conductor 602 in DP SRAM cell 202/302. Conductor 622 is the rightmost conductor and is a bit line landing pad for bit line BL-B bar. A via in via layer 1 connects the conductor 622 to the conductor 278 in metal layer M1.

Conductor 618 is a bit line landing pad for bit line BL-A bar. A via in via layer 1 connects the conductor 618 to the conductor 259 in metal layer M1. Conductor 620 in DP SRAM cell 204/304 corresponds to conductor 618 in DP SRAM cell 202/302. Conductor 620 is a bit line landing pad for bit line BL-A bar. A via in via layer 1 connects the conductor 618 to the conductor 269 in metal layer M1.

Conductors 624, 626, 628, 630, 632, 634, 636, 638, 640, 642, are each located in the M3 metal layer. Conductors 624, 626, 628, 630, 632, 634, 636, 638, 640, 642 each define a long axis that is parallel to the Y-axis. Conductors 624, 626, 628, 630, 632 are located in the DP SRAM cell 202/302 while conductors 634, 636, 638, 640, 642 are in the DP SRAM cell 204/304. Conductor 624 in DP SRAM cell 202/302 corresponds with conductor 642 in DP SRAM cell 204/304. Conductor 626 in DP SRAM cell 202/302 corresponds with conductor 640 in DP SRAM cell 204/304. Conductor 628 in DP SRAM cell 202/302 corresponds with conductor 638 in DP SRAM cell 204/304. Conductor 630 in DP SRAM cell 202/302 corresponds with conductor 636 in DP SRAM cell 204/304. Conductor 632 in DP SRAM cell 202/302 corresponds with conductor 634 in DP SRAM cell 204/304. An explanation is provided with respect to conductors 624, 626, 628, 630, 632 and an explanation of conductors 634, 636, 638, 640, 642 is omitted for the sake of brevity. However, it is understood that the configuration of conductors 634, 636, 638, 640, 642 is the same as that of conductors 624, 626, 628, 630, 632 except that conductors 634, 636, 638, 640, 642 are a mirror image of conductors 624, 626, 628, 630, 632 with respect to the Y-axis.

Conductor 624 is between the leftmost boundary 284 of DP SRAM cell 202/302 and the conductor 626. The conductor 624 is the bit line BL-B-bar. A via in a via layer 2 connects the conductor 624 to conductor 616 in metal layer M2. Via layer 2 is a via layer between metal layer M2 and metal layer M3.

Conductor 626 is between the conductor 624 and the conductor 628. The conductor 626 is the bit line BL-B. A via in via layer 2 connects the conductor 626 to conductor 602 in metal layer M2.

Conductor 628 is between the conductor 626 and the conductor 630. The conductor 628 is a reference voltage conductor configured to receive reference voltage VSS. A via in via layer 2 connects the conductor 628 to conductor 612 in metal layer M2.

Conductor 630 is between the conductor 628 and the conductor 632. The conductor 630 is the bit line BL-A bar. A via in via layer 2 connects the conductor 630 to conductor 618 in metal layer M2.

Conductor 632 is between the conductor 630 and the inner boundary 282 between the DP SRAM cell 202/302 and the DP SRAM cell 204/304. The conductor 632 is the bit line BL-A. A via in via layer 2 connects the conductor 632 to conductor 604 in metal layer M2.

By the configuration discussed above with respect to FIG. 6, instances of DP SRAM 100 configured in accordance with the embodiments depicted in FIGS. 2 and 3 include power source voltage paths positioned in metal layer M1, word line and reference voltage paths positioned in metal layer M2, and bit line and reference voltage paths positioned in metal layer M3. Compared to other approaches, the instances of DP SRAM 100 are thereby capable of including electrical connections having reduced levels of parasitic resistance and capacitance, and increased density and scalability.

Figure 7:
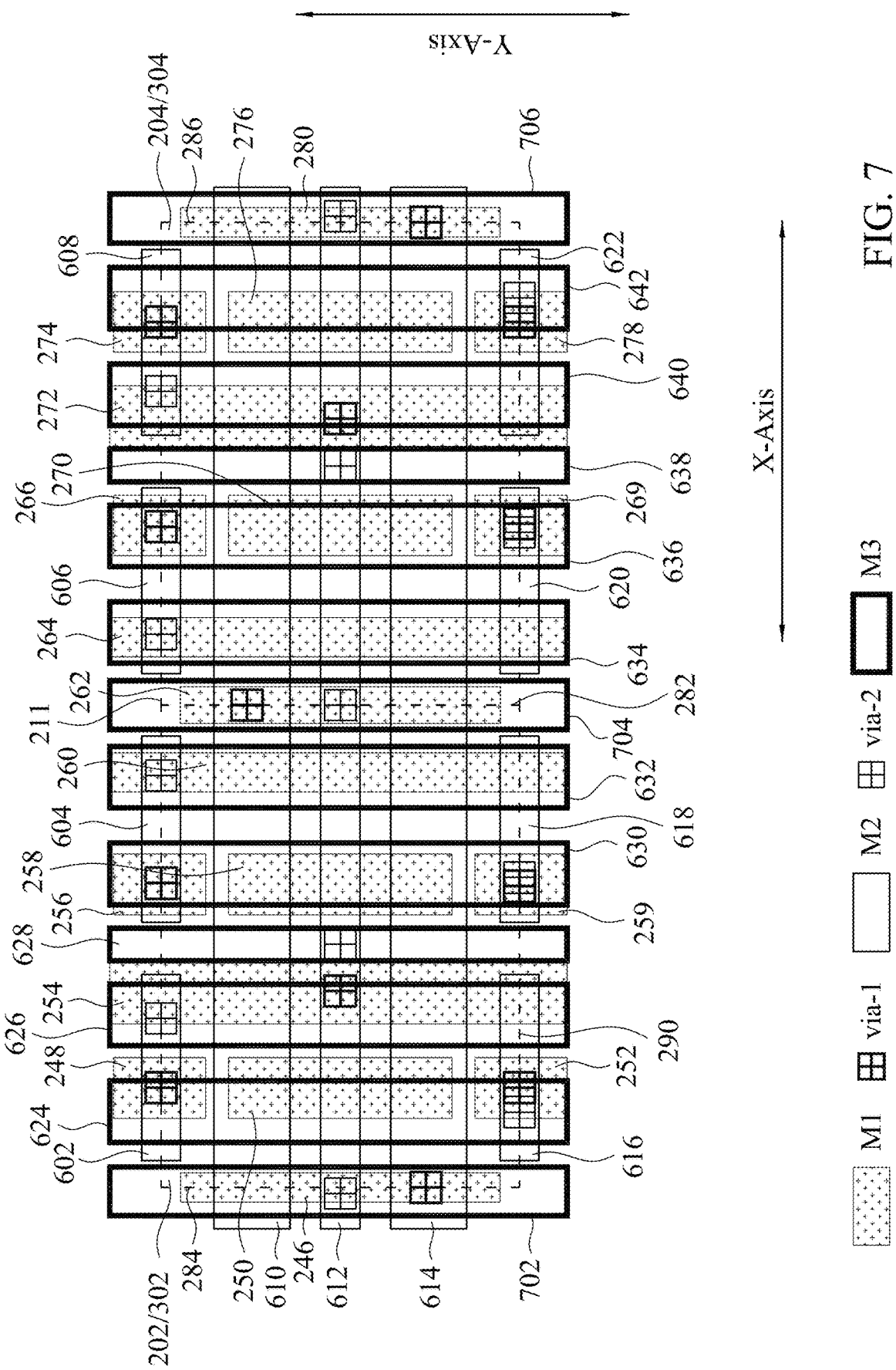
FIG. 7 is a top view of a layout of a conductive structure of DP SRAM cells, in accordance with some embodiments.

FIG. 7 is a top view of a conductive structure located in the M1 metal layer, the M2 metal layer, and the M3 metal layer of the DP SRAM cells 202, 204 or 302, 304.

Conductors 246, 248, 250, 252, 254, 256, 258, 259, 260, 262, 264, 266, 269, 270, 272, 274, 276, 278, 280 are provided in the metal layer M1 as discussed above with respect to FIGS. 2 and 3, conductors 602, 604, 606, 608, 610, 612, 614, 616, 618, 620, 622 are provided in the metal layer M2 as discussed above with respect to FIG. 6, and conductors 624, 626, 628, 630, 632, 634, 636, 638, 640, 642 are provided in the metal layer M3 as discussed above with respect to FIG. 6.

In the embodiment depicted in FIG. 7, the conductive structure further includes the conductors 702, 704, 706 in the metal layer M3. Conductors 702, 704, 706 each define a long axis that is parallel to the Y-axis. Conductor 702 is located in the DP SRAM cell 202/302 while conductor 706 is in the DP SRAM cell 204/304. Conductor 704 is shared between the DP SRAM cells 202/302, 204/304.

Conductor 702 extends along the left most boundary 284. The conductor 702 is a reference voltage conductor configured to receive reference voltage VSS. A via in via layer 2 connects the conductor 702 to conductor 612 in metal layer M2.

Conductor 704 extends along the inner boundary 282. The conductor 704 is a reference voltage conductor configured to receive reference voltage VSS. A via in via layer 2 connects the conductor 704 to conductor 612 in metal layer M2.

Compared to the embodiment depicted in FIG. 6, the conductive structure depicted in FIG. 7 includes additional reference voltage conductors connected in parallel and is thereby capable of having a lower reference voltage path resistance.

Figure 8:
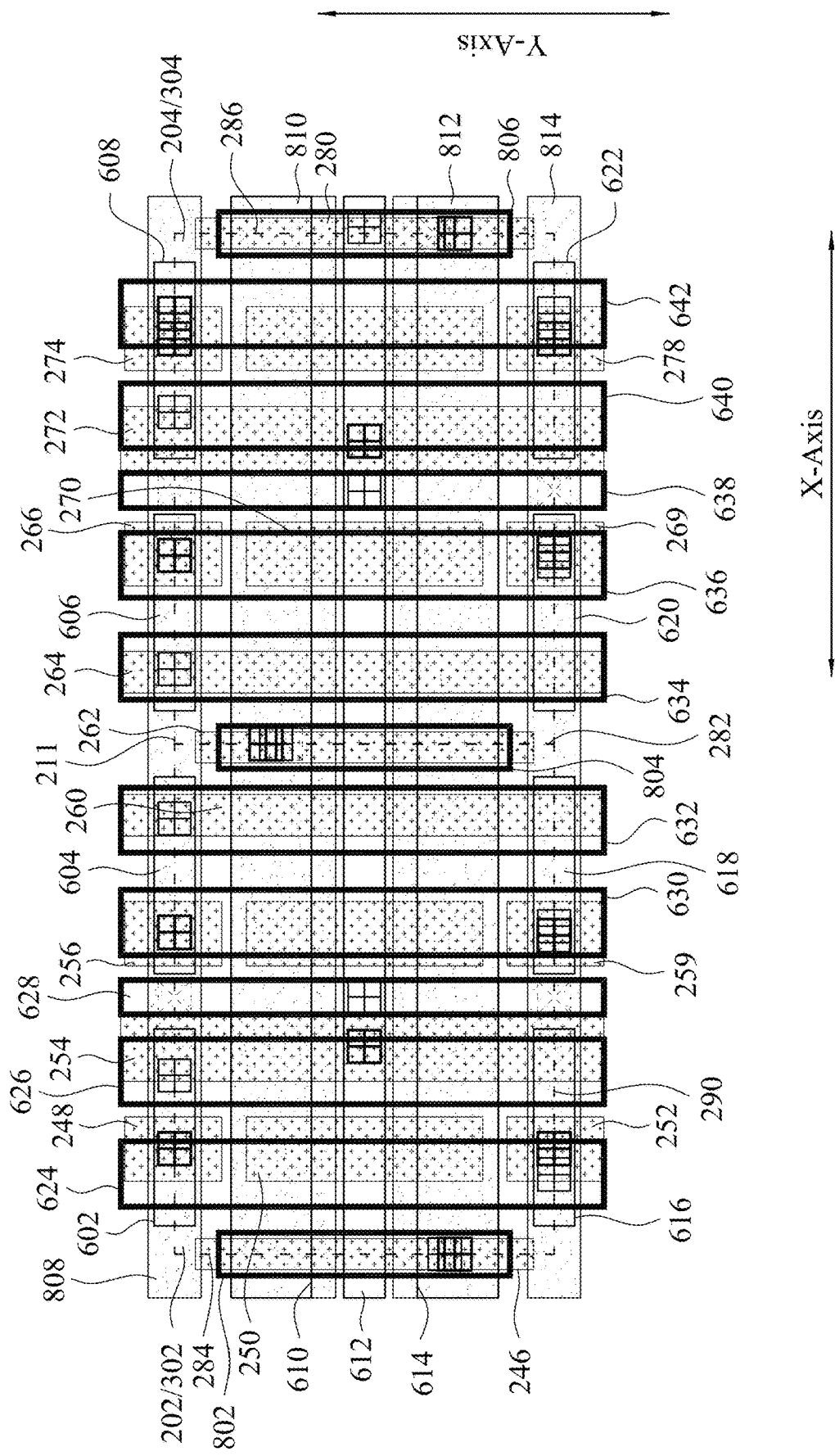
FIG. 8 is a top view of a layout of a conductive structure of DP SRAM cells, in accordance with some embodiments.

FIG. 8 is a top view of a conductive structure located in the M1 metal layer, the M2 metal layer, M3 metal layer, and the M4 metal layer of the DP SRAM cells 202, 204 or 302/304.

Conductors 246, 248, 250, 252, 254, 256, 258, 259, 260, 262, 264, 266, 269, 270, 272, 274, 276, 278, 280 are provided in the metal layer M1 as discussed above with respect to FIGS. 2 and 3, conductors 602, 604, 606, 608, 610, 612, 614, 616, 618, 620, 622 are provided in the metal layer M2 as discussed above with respect to FIG. 6, and conductors 624, 626, 628, 630, 632, 634, 636, 638, 640, 642 are provided in the metal layer M3 as discussed above with respect to FIG. 6.

In the embodiment depicted in FIG. 8, the conductive structure further includes the conductors 802, 804, 806 in the metal layer M3. Conductors 802, 804, 806 each define a long axis that is parallel to the Y-axis. Conductor 802 is located in the DP SRAM cell 202/302 while conductor 806 is in the DP SRAM cell 204/304. Conductor 804 is shared between the DP SRAM cells 202/302, 204/304.

Conductor 802 extends along the leftmost boundary 284. The conductor 802 is a word line landing pad for another word line WL-B in metal layer M4. Metal layer M4 is above metal layer M3. A via in via layer 2 connects the conductor 802 to conductor 614 in metal layer M2.

Conductor 804 extends along the inner boundary 282. The conductor 804 is a word line landing pad for another word line WL-A in metal layer M4. A via in via layer 2 connects the conductor 804 to conductor 610 in metal layer M2.

Conductor 806 extends along the rightmost boundary 286. The conductor 806 is a word line landing pad for the other word line WL-B in metal layer M4. A via in via layer 2 connects the conductor 806 to conductor 614 in metal layer M2.

Conductors 808, 810, 812, 814 are each located in the M4 metal layer. Conductors 808, 810, 812, 814 each define a long axis that is parallel to the X-axis. Conductors 808, 810, 812, 814 are separated with respect to the Y-axis and extend across the DP SRAM cells 202/302, 204/304.

Conductor 808 extends across the upper boundary 211. Conductor 808 is a reference voltage conductor and is configured to receive the reference voltage VSS. A via in a via layer 3 connects the conductor 808 to the conductor 628. Via layer 3 is a via layer between metal layer M4 and metal layer M3. A via in via layer 3 connects the conductor 808 to the conductor 638.

Conductor 810 is between the conductor 808 and the conductor 812. The conductor 810 is another word line WL-A. In this case, there is a double world line WL-A, one which is conductor 610 in metal layer M2 and another which is conductor 810 in metal layer M4. A via in via layer 3 connects the conductor 810 to the conductor 804 in metal layer M3.

Conductor 812 is between the conductor 810 and the conductor 814. The conductor 812 is another word line WL-B. In this embodiment, there is a double world line WL-B, one which is conductor 614 in metal layer M2 and another which is conductor 812 in metal layer M4. A via in via layer 3 connects the conductor 812 to the conductor 802 in metal layer M3. A via in via layer 3 connects the conductor 812 to the conductor 806 in metal layer M3.

Conductor 814 extends across the lower boundary 290. Conductor 814 is a reference voltage conductor and is configured to receive the reference voltage VSS. A via in via layer 3 connects the conductor 808 to the conductor 628. A via in via layer 3 connects the conductor 808 to the conductor 638.

Compared to the embodiments depicted in FIGS. 6 and 7, the conductive structure depicted in FIG. 8 includes additional word line conductors connected in parallel and is thereby capable of having a lower word line path resistance.

Figure 9:
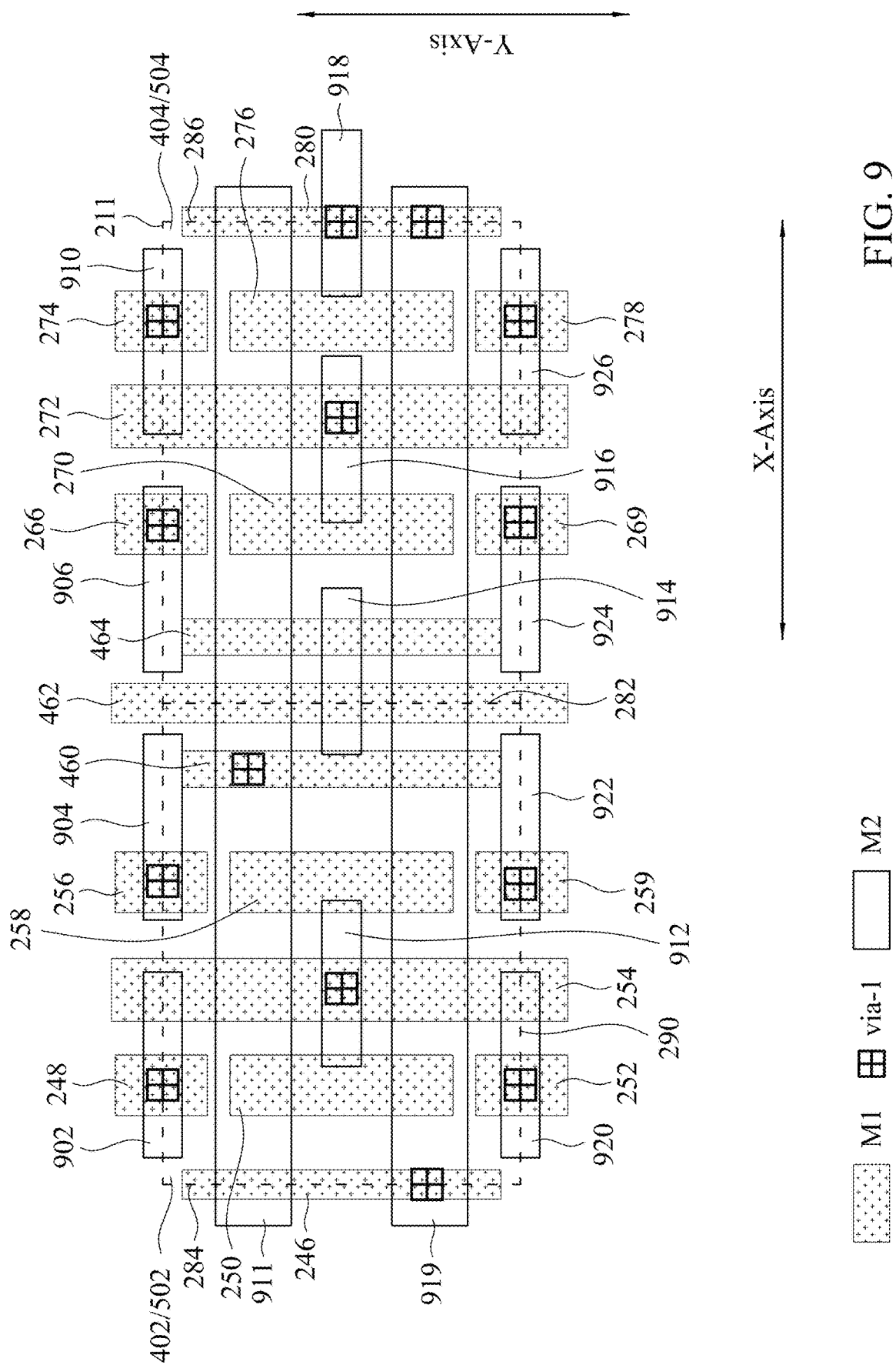
FIG. 9 is a top view of a layout of a conductive structure of DP SRAM cells, in accordance with some embodiments.
Figure 10:
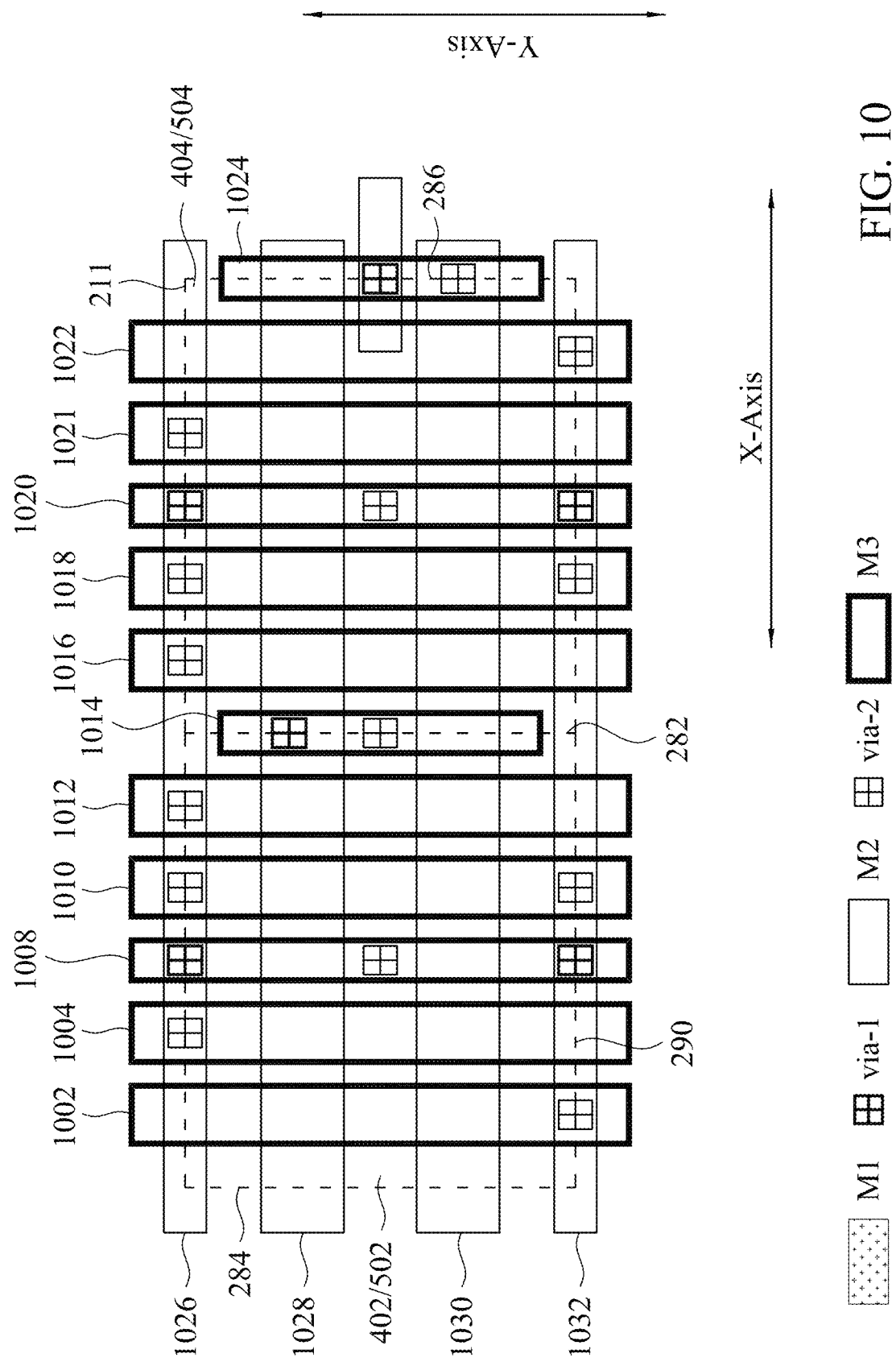
FIG. 10 is a top view of a layout of a conductive structure of DP SRAM cells, in accordance with some embodiments.

FIGS. 9 and 10 are top views of portions of a conductive structure located in the M1 through M4 metal layers of the DP SRAM cells 402, 404 or 502, 504. FIG. 9 is a top view of the portion of the conductive structure located in the M1 metal layer and the M2 metal layer, and FIG. 10 is a top view of the portion of the conductive structure located in the M3 metal layer and the M4 metal layer.

Referring to FIG. 9, conductors 246, 248, 250, 252, 254, 256, 258, 259, 460, 462, 464, 266, 269, 270, 272, 274, 276, 278, 280 are provided in the metal layer M1 as discussed above with respect to FIGS. 2-5.

The DP SRAM cells 402/502, 404/504 are configured such that DP SRAM cell 402/502 uses word lines WL-A1, WL-B1, which are provided in metal layer M2 while DP SRAM cell 404/504 uses word lines WL-A2, WL-B2, which are provided in metal layer M4. Conductor 246 is thus a word line landing pad in the metal layer M1 for a word line WL-B1 (i.e., conductor 919) in metal layer M2. Conductor 460 is a word line landing pad in the metal layer M1 for a word line WL-A1 (i.e., conductor 911) in metal layer M2. Conductor 464 is a word line landing pad in the metal layer M1 for a word line WL-A2 (i.e., conductor 1028) in metal layer M4. Conductor 280 is thus a word line landing pad in the metal layer M1 for a word line WL-B2 (i.e., conductor 1030) in metal layer M4.

Conductors 902, 904, 906, 908, 910, 912, 914, 916, 918, 920, 922, 924, 926 are each located in the M2 metal layer. Conductors 902, 904, 906, 908, 910, 912, 914, 916, 918, 920, 922, 924, 926 each define a long axis that is parallel to the X-axis.

Conductors 902, 904, 906, 908 each extend along the upper boundary 211 of the DP SRAM cells 402/502, 404/504 and are aligned with respect to the Y-axis and separated with respect to the X-axis. Conductors 902, 904 are provided in the DP SRAM cell 402/502 and conductors 906, 908 are provided in the DP SRAM cell 404/504.

Conductor 902 is the leftmost conductor and is a bit line landing pad for bit line BL-B. A via in via layer 1 connects the conductor 902 to the conductor 248 in metal layer M1. Conductor 908 in DP SRAM cell 404/504 corresponds to conductor 902 in DP SRAM cell 402/502. Conductor 908 is the rightmost conductor and is a bit line landing pad for bit line BL-B. A via in via layer 1 connects the conductor 908 to the conductor 274 in metal layer M1.

Conductor 904 is a bit line landing pad for bit line BL-A. A via in via layer 1 connects the conductor 904 to the conductor 256 in metal layer M1. Conductor 906 in DP SRAM cell 404/504 corresponds to conductor 904 in DP SRAM cell 402/502. Conductor 906 is a bit line landing pad for bit line BL-A. A via in via layer 1 connects the conductor 906 to the conductor 266 in metal layer M1.

Conductor 911 is between conductors 902, 904, 906, 908 and conductors 912, 914, 916, 918. Conductor 911 extends across the DP SRAM cells 402/502, 404/504. Conductor 911 is a word line WL-A1 in metal layer M2. A via in via layer 1 connects the conductor 911 to the conductor 460 of DP SRAM cell 402/502 in metal layer M1.

Conductors 912, 914, 916, 918 each are between the conductor 911 and the conductor 919. Conductors 912, 914, 916, 918 each have a long axis that extends parallel with the X-axis. Conductors 912, 914, 916, 918 are aligned with respect to the Y-axis and separated with respect to the X-axis. Conductor 912 is provided in the DP SRAM cell 402/502 and conductors 914, 916, 918 are provided in the DP SRAM cell 404/504.

Conductor 912 is located above the conductor 254. Conductor 912 is a reference voltage landing pad. A via in via layer 1 connects the conductor 912 to the conductor 254. Conductor 916 in DP SRAM cell 404/504 corresponds with conductor 912 in DP SRAM cell 402/502. Conductor 916 is located above the conductor 272. Conductor 916 is a reference voltage landing pad. A via in via layer 1 connects the conductor 916 to the conductor 272.

Conductor 914 is located above the conductor 464. Conductor 914 is a word line landing pad for the word line WL-A2 in metal layer M4. A via in via layer 1 connects the conductor 914 to the conductor 464.

Conductor 918 is located above the conductor 280. Conductor 918 is a word line landing pad for the word line WL-B2 in metal layer M4. A via in via layer 1 connects the conductor 918 to the conductor 280.

Conductors 920, 922, 924, 926 each extend along the lower boundary 290 of the DP SRAM cells 402/502, 404/504 and are aligned with respect to the Y-axis and separated with respect to the X-axis. Conductors 920, 922 are provided in the DP SRAM cell 402/502 and conductors 924, 926 are provided in the DP SRAM cell 404/504.

Conductor 920 is the leftmost conductor and is a bit line landing pad for bit line BL-B bar. A via in via layer 1 connects the conductor 920 to the conductor 252 in metal layer M1. Conductor 926 in DP SRAM cell 404/504 corresponds to conductor 920 in DP SRAM cell 402/502. Conductor 926 is the rightmost conductor and is a bit line landing pad for bit line BL-B bar. A via in via layer 1 connects the conductor 926 to the conductor 278 in metal layer M1.

Conductor 922 is a bit line landing pad for bit line BL-A bar. A via in via layer 1 connects the conductor 922 to the conductor 259 in metal layer M1. Conductor 924 in DP SRAM cell 404/504 corresponds to conductor 922 in DP SRAM cell 402/502. Conductor 924 is a bit line landing pad for bit line BL-A bar. A via in via layer 1 connects the conductor 924 to the conductor 269 in metal layer M1.

Referring to FIG. 10, conductors 1002, 1004, 1008, 1010, 1012, 1014, 1016, 1018, 1020, 1021, 1022, 1024 are each located in the M3 metal layer. Conductors 1002, 1004, 1008, 1010, 1012, 1014, 1016, 1018, 1020, 1021, 1022, 1024 each define a long axis that is parallel to the Y-axis. Conductors 1002, 1004, 1008, 1010, 1012 are located in the DP SRAM cell 402/502 while conductors 1016, 1018, 1020, 1021, 1022, 1024 are in the DP SRAM cell 404/504. Conductor 1014 is shared between DP SRAM cell 402/502 and DP SRAM cell 404/504. Conductor 1002 in DP SRAM cell 402/502 corresponds with conductor 1022 in DP SRAM cell 404/504. Conductor 1004 in DP SRAM cell 402/502 corresponds with conductor 1021 in DP SRAM cell 404/504. Conductor 1008 in DP SRAM cell 402/502 corresponds with conductor 1020 in DP SRAM cell 404/504. Conductor 1010 in DP SRAM cell 402/502 corresponds with conductor 1018 in DP SRAM cell 404/504. Conductor 1012 in DP SRAM cell 402/502 corresponds with conductor 1016 in DP SRAM cell 404/504. An explanation is provided with respect to conductors 1002, 1004, 1008, 1010, 1012 and an explanation of conductors 1016, 1018, 1020, 1021, 1022 is omitted for the sake of brevity. However, it is understood that the configuration of conductors 1002, 1004, 1008, 1010, 1012 is the same as conductors 1016, 1018, 1020, 1021, 1022 except that conductors 1016, 1018, 1020, 1021, 1022 are a mirror image of conductors 1002, 1004, 1008, 1010, 1012 with respect to the Y-axis.

Conductor 1002 is between the leftmost boundary 284 of DP SRAM cell 402/502 and the conductor 1004. The conductor 1002 is the bit line BL-B bar. A via in via layer 2 connects the conductor 1002 to conductor 920 (depicted in FIG. 9) in metal layer M2.

Conductor 1004 is between the conductor 1002 and the conductor 1008. The conductor 1004 is the bit line BL-B. A via in via layer 2 connects the conductor 1004 to conductor 902 (depicted in FIG. 9) in metal layer M2.

Conductor 1008 is between the conductor 1004 and the conductor 1010. The conductor 1008 is a reference voltage conductor configured to receive reference voltage VSS. A via in via layer 2 connects the conductor 1008 to conductor 912 (depicted in FIG. 9) in metal layer M2.

Conductor 1010 is between the conductor 1008 and the conductor 1012. The conductor 1010 is the bit line BL-A bar. A via in via layer 2 connects the conductor 1010 to conductor 922 (depicted in FIG. 9) in metal layer M2.

Conductor 1012 is between the conductor 1010 and the inner boundary 282 between the DP SRAM cell 402/502 and the DP SRAM cell 404/504. The conductor 1012 is the bit line BL-A. A via in via layer 2 connects the conductor 1012 to conductor 904 (depicted in FIG. 9) in metal layer M2.

Conductor 1014 is a word line landing pad in metal layer M3 and serves to route the word line WL-A2 in metal layer M4. Conductor 1014 extends across the inner boundary 282. A via in via layer 2 connects the conductor 1014 to conductor 914 (depicted in FIG. 9) in metal layer M2.

Conductor 1024 is a word line landing pad in metal layer M3 and serves to route the word line WL-B2 in metal layer M4. Conductor 1024 extends across the right boundary 286. A via in via layer 2 connects the conductor 1024 to conductor 918 (depicted in FIG. 9) in metal layer M2.

Conductors 1026, 1028, 1030, 1032 are each located in the M4 metal layer. Conductors 1026, 1028, 1030, 1032 each define a long axis that is parallel to the X-axis. Conductors 1026, 1028, 1030, 1032 are separated with respect to the Y-axis and extend across the DP SRAM cells 402/502, 404/504.

Conductor 1026 extends across the upper boundary 211. Conductor 1026 is a reference voltage conductor and is configured to receive the reference voltage VSS. A via in via layer 3 connects the conductor 1026 to the conductor 1008. A via in via layer 3 connects the conductor 1026 to the conductor 1020.

Conductor 1028 is between the conductor 1026 and the conductor 1030. The conductor 1028 is word line WL-A2. In this case, the world line WL-A2 is connected to the gates of PG-1, PG-2 in the DP SRAM cell 404/504. A via in via layer 3 connects the conductor 1028 to the conductor 1014 in metal layer M3. Conductor 1014 is connected to conductor 914 (depicted in FIG. 9) and conductor 914 in metal layer M2 connects to conductor 464 in metal layer M1. The word line WL-A2 (conductor 911—depicted in FIG. 9) is located in metal layer M2.

Conductor 1030 is between the conductor 1028 and the conductor 1032. The conductor 1030 is word line WL-B2. In this case, the world line WL-B2 is connected to the gates of PG-3, PG-4 in the DP SRAM cell 404/504. A via in via layer 3 connects the conductor 1030 to the conductor 1024 in metal layer M3. Conductor 1024 is connected to conductor 918 (depicted in FIG. 9) and conductor 918 in metal layer M2 connects to conductor 280 in metal layer M1. The word line WL-B2 (conductor 919—depicted in FIG. 9) is located in metal layer M2.

Conductor 1032 extends across the lower boundary 290. Conductor 1032 is a reference voltage conductor and is configured to receive the reference voltage VSS. A via in via layer 3 connects the conductor 1032 to the conductor 1008. A via in via layer 3 connects the conductor 1032 to the conductor 1020.

By the configuration discussed above with respect to FIGS. 9 and 10, instances of DP SRAM 100 configured in accordance with the embodiments depicted in FIGS. 4 and 5 include word line paths positioned in metal layer M2 and connected to DP SRAM cell 402/502, and separate word line paths positioned in metal layer M4 and connected to DP SRAM cell 404/504. Compared to other approaches, the instances of DP SRAM 100 are thereby capable of being independently controlled in read and write operations.

FIG. 11 is a block diagram of a memory circuit 1100 having an array of DP SRAM cells 1102, word lines B2, B1, A2, A1, bit lines BL-A, BL-A bar, BL-B, BL-B bar, a column multiplexer/sense amplifier/write driver circuit 1104, and a word line decoder/driver circuit 1106. Word lines B2, B1, A2, A1 correspond to respective word lines WL-B2, WL-B1, WL-A2, WL-A1 discussed above with respect to FIGS. 9 and 10.

The DP SRAM cells 1102 are arranged in rows and columns. Each column of DP SRAM cells 1102 includes pairs of DP SRAM cells 1102 which are adjacent to one another with respect to the Y axis and correspond to DP SRAM pairs 402 and 404 discussed above with respect to FIG. 4 or DP SRAM pairs 502 and 504 discussed above with respect to FIG. 5.

Columns are labeled Column N, column N+1, Column N+2, Column N+3. Thus, the embodiment shown in FIG. 11 has four columns. Other embodiments of the memory circuit 1100 can have more than four columns or fewer than four columns.

Furthermore, two rows of word lines run across each of the rows of DP SRAM cells. Each row of word lines is labeled M, M+1, M+2, M+3, M+4, M+5, M+6, M+7. Word lines A1, B1 are word lines WL-A1, WL-B1 in metal layer M2. Word lines A2, B2 are word lines WL-A2, WL-B2 in metal layer M4. In this example, there are eight rows of word lines and four rows of DP SRAM cells 1102. The first row of DP SRAM cells 1102 has rows M, M+1 of word lines. The second adjacent row of DP SRAM cells 1102 has rows M+2, M+3 of word lines. The third adjacent row of DP SRAM cells 1102 has rows M+4, M+5 of word lines. The fourth adjacent row of DP SRAM cells 1102 has rows M+4, M+5 of word lines. In other embodiments, there are more than four or fewer than four rows of DP SRAM cells 1102. In other embodiments, there are more than eight or fewer than eight rows of DP SRAM word lines.

Word lines A1, B1 are found in rows M+1, M+2, M+5, M+6. Word lines A2, B2 are found in rows M, M+3, M+4, M+7. Consequently this ensures that the same type of word lines A1, B1, A2, B2 are adjacent to one another from one row of DP SRAM cells 1102 to another row of DP SRAM cells 1102. Thus, with respect to the X-axis, the order of the word lines in metal layer M2 alternates between B1, A1 and A1, B1, and the order of the word lines in metal layer M4 alternates between A2, B2 and B2, A2. In some embodiments, the pairs of adjacent word line types correspond to common logic circuits (not shown) within word line decoder/driver circuit 1106.

The order of the bit lines with respect to the X-axis alternates from BL-A, BL-A bar, BL-B, BL-B bar, BL-B bar, BL-B, BL-A, BL-A bar to BL-B bar, BL-B bar, BL-B, BL-A, BL-A, BL-B bar, BL-B bar, BL-B, BL-A, BL-A.

By arranging the DP SRAM cells 1102 as discussed, adjacent DP SRAM cells 1102 in different columns share a landing pad within metal layer M1, thus allowing the memory circuit 1100 to have a more compact arrangement compared to other approaches. This arrangement is explained in further detail below with respect to FIG. 12.

Within column N+1, the left DP SRAM cell in the top row has a landing pad in metal layer M1 that is connected to the word line A1 in metal layer M2 within row M+6 and a landing pad that is connected to the word line B1 within row M+6. Note that the left DP SRAM cell 1102 in column N+2 shares the landing pad connected to the word line B1 with the right DP SRAM cell 1102 in column N+1. The right DP SRAM cell 1102 within column N+1 in the top row has a landing pad in metal layer M1 that is connected to the word line A2 in metal layer M4 in row M+7 and a landing pad in metal layer M1 that is connected to the word line B2 within row M+7. Note that the right DP SRAM cell 1102 within column N+1 in the top row shares the landing pad that connects to the word line B2 with the left DP SRAM cell in column N+3 in row M+7.

Within column N+1, the left DP SRAM cell in the second row from the top has a landing pad in metal layer M1 that is connected to the word line A1 in metal layer M2 within row M+5 and a landing pad that is connected to the word line B1 within row M+5. Note that the left DP SRAM cell 1102 in column N+2 shares the landing pad connected to the word line B1 with the right DP SRAM cell 1102 in column N+1. The right DP SRAM cell 1102 within column N+1 in the second row from the top has a landing pad in metal layer M1 that is connected to the word line A2 in metal layer M4 in row M+7 and a landing pad in metal layer M1 that is connected to the word line B2 within row M+7. Note that the right DP SRAM cell 1102 within column N+1 in the second row from the top shares the landing pad that connects to the word line B2 with the left DP SRAM cell in column N+3 in row M+7. This pattern repeats throughout all of the array of DP SRAM cells 1102.

By the configuration discussed above, memory circuit 1100 includes rows having independently controllable groups of DP SRAM cells 1102, and is thereby capable of more flexible memory cell access compared to other approaches.

A non-limiting example of an arrangement of the DP SRAM cells 1102 is discussed now with respect to FIG. 12.

FIG. 12 is a block diagram illustrating an arrangement of DP SRAM cells. Each DP SRAM cell is represented by a box. There are two columns of DP SRAM cells, column 1 and column 2. There are four rows of DP SRAM cells row 1, row 2, row 3, row 4.

There is a number in each of the boxes that represents a DP SRAM cell. The numbers are for arrangement 1, arrangement 2, arrangement 3, and arrangement 4. Arrangement 1 is the arrangement for the DP SRAM cell 402 or 502 shown in FIG. 4 or 5, FIG. 8, and FIG. 9. Arrangement 2 corresponds to the arrangement of DP SRAM cell 404 or 504 shown in FIG. 4 or 5, FIG. 8, and FIG. 9. Arrangement 2 is thus a mirror image of arrangement 1 with respect to the X-axis. Arrangement 3 corresponds to DP SRAM cell 402' or 502' and is a mirror image of arrangement 1 with respect to the X-axis. Arrangement 4 corresponds to DP SRAM cell 404' or 504' and is a mirror image of arrangement 3 with respect to the Y-axis. Thus, arrangement 4 is a mirror image of arrangement 1 with respect to both the X-axis and the Y-axis.

Within row 1 and column 1, the arrangement of the DP SRAM cells is ordered as arrangement 1 on the left and arrangement 2 on the right. Within row 1 and column 2, the arrangement of the DP SRAM cells is ordered as arrangement 2 on the left and arrangement 1 on the right. Therefore, the two adjacent DP SRAM cells with arrangement 2 can share a landing pad for a common word line. If there column 3, the pattern in column 1 would repeat resulting in two adjacent DP SRAM cells with arrangement 1 (one would be the right DP SRAM cell in column 2, row 1 and another would be the left DP SRAM cell in column 3, row 1). These two adjacent DP SRAM cell would also share a landing pad in metal layer M1.

Within row 2 and column 1, the arrangement of the DP SRAM cells is ordered as arrangement 3 on the left and arrangement 4 on the right. Within row 2 and column 2, the arrangement of the DP SRAM cells is ordered as arrangement 4 on the left and arrangement 3 on the right. Therefore, the two adjacent DP SRAM cells with arrangement 4 can share a landing pad for a common word line. In embodiments including a column 3 (not shown), the pattern in column 1 would repeat resulting in two adjacent DP SRAM cells with arrangement 3 (one would be the right DP SRAM cell in column 2, row 2 and another would be the left DP SRAM cell in column 3, row 2). These two adjacent DP SRAM cells would also share a landing pad in metal layer M1.

Row 3 has the same arrangement as row 1, and row 4 has the same arrangement as row 2. Thus, the arrangement of row 1 would be provided in every odd numbered column regardless of the number of rows, and the arrangement of row 2 would be provided in every even numbered row regardless of the number of rows. The arrangement of column 1 would be provided in every odd numbered column regardless of the number of columns, and the arrangement of column 2 would be provided in every even numbered column regardless of the number of columns. As such, this configuration maximizes the number of DP SRAM cells having an adjacent cell with the same arrangement and thus maximizes the number of DP SRAM cells that can share a landing pad in metal layer M1. Compared to other approaches, the configuration discussed above with respect to FIG. 12 thereby allows for a more compact arrangement in an array of memory cells.

FIG. 13 is a cross sectional view illustrating the organization of the various layers of a semiconductor device. The cross sectional view is taken with respect to the X-axis and the Z-axis and is simplified for the purpose of illustration.

In various embodiments, the various features of the semiconductor device depicted in FIG. 13 are non-limiting examples of portions of DP SRAM cell 100 in FIG. 1A and FIG. 1B, DP SRAM cells 202, 204 shown in FIGS. 2 and 6-8, DP SRAM cells 302, 304 in FIGS. 3 and 6-8, DP SRAM cells 402, 404 shown in FIGS. 4, 9 and 10, DP SRAM cells 502, 504 shown in FIGS. 5, 9 and 10, DP SRAM cells 1102 shown in FIG. 11, or block diagrams of DP SRAM cells shown in FIG. 12.

As shown, a semiconductor substrate is located at the bottom of the various layers with respect to the Z axis. An N-well or P-well is formed within the semiconductor substrate. Active regions are also formed that extend out of the semiconductor substrate from the N-well or P-well in some embodiments such as that shown in FIG. 13. Gate electrodes in are formed over the active regions to form the gates of transistors. In various embodiments, the simplified active regions and gates depicted in FIG. 13 represent planar transistors, FinFETs, GAA transistors, or other similar devices.

Above the gate layer is a gate via layer. Vias are located in the gate via layer to connect the gate electrodes in the gate layer to conductors in metal layer M1. At other locations, a contact layer is located over the semiconductor substrate. Contact layer includes contacts that are formed over active regions and form the contacts for the drain and sources of transistors. An S/D via layer is located over the contact layer and below the metal layer M1. The S/D via layer includes vias that connect contacts in the contact layer to conductors in the metal layer M1.

Metal layer M1 is located above the S/D via layer and the gate via layer. A via layer 1 is located above the metal layer M1 and below the metal layer M2. Via layer 1 includes vias that connect conductors in metal layer M1 to conductors in metal layer M2.

Metal layer M2 is located above the via layer 1. A via layer 2 is located above the metal layer M2 and below the metal layer M3. Via layer 2 includes vias that connect conductors in metal layer M2 to conductors in metal layer M3.

Metal layer M3 is located above the via layer 2. A via layer 3 is located above the metal layer M3 and below the metal layer M4. Via layer 3 includes vias that connect conductors in metal layer M3 to conductors in metal layer M4.

Metal layer M4 is located above the via layer 3. In some embodiments, additional metal layers and via layers are located above metal layer M4. With respect to gate via layer, SD/via layer, contact layer, via layer 1, via layer 2, via layer 3 and metal layer M1, metal layer M2, metal layer M3, and metal layer M4, a conductive layer, e.g., a metal, is deposited over the substrate with the transistors formed thereon, thereby making electrical connections to the drain/source regions and gates of the transistors.

A memory circuit including features configured in accordance with the various embodiments discussed above and arranged as illustrated in FIG. 13 is capable of realizing the various benefits discussed above.

Figure 14:
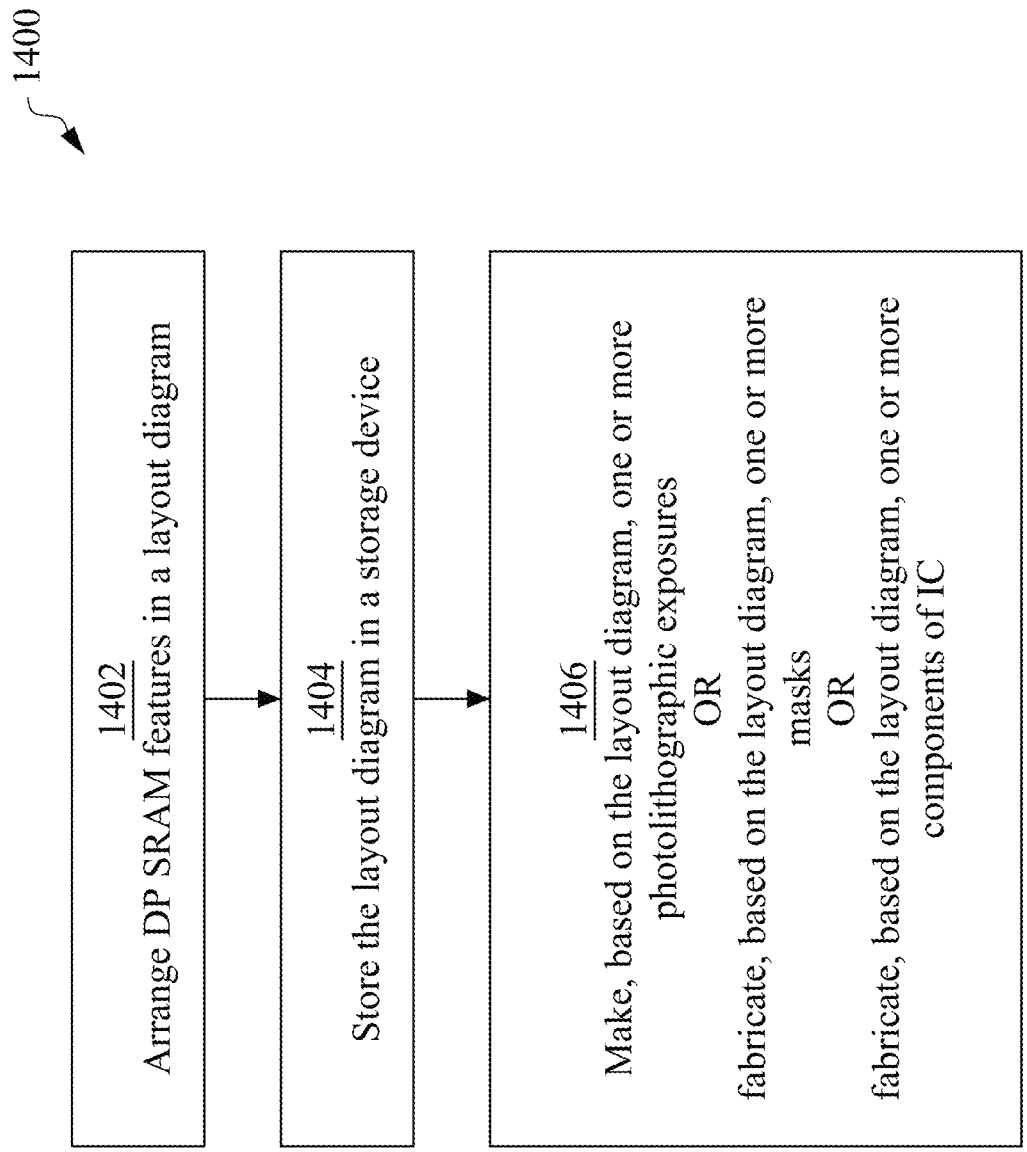
FIG. 14 is a flowchart of a method of generating an IC layout diagram, in accordance with some embodiments.

FIG. 14 is a flowchart of a method 1400 of generating an IC layout diagram, in accordance with some embodiments.

In some embodiments, the operations of method 1400 are performed in the order depicted in FIG. 14. In some embodiments, the operations of method 1400 are performed simultaneously and/or in an order other than the order depicted in FIG. 14. In some embodiments, one or more operations are performed before, between, during, and/or after performing one or more operations of method 1400.

Method 1400 is implementable, for example, using an EDA system 1600 (FIG. 16, discussed below) and/or IC manufacturing system 1700 (FIG. 17, discussed below), in accordance with some embodiments.

In FIG. 14, method 1400 includes blocks 1402-1406. At block 1402, DP SRAM features are arranged in an IC layout diagram. In various embodiments, the DP SRAM features correspond to IC layout diagrams including DP SRAM cells 202, 204 shown in FIGS. 2 and 6-8, DP SRAM cells 302, 304 in FIGS. 3 and 6-8, DP SRAM cells 402, 404 shown in FIGS. 4, 9 and 10, DP SRAM cells 502, 504 shown in FIGS. 5, 9 and 10, or DP SRAM cells 1102 shown in FIG. 11.

At block 1404, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in IC layouts 1607 or over network 1614 of EDA system 1600, discussed below with respect to FIG. 16.

At block 1406, in some embodiments, based on the layout diagram, at least one of (A) one or more photolithographic exposures are made or (B) one or more semiconductor masks are fabricated or (C) one or more components in a layer of a semiconductor device are fabricated. Details corresponding to block 1406 are discussed below with respect to IC manufacturing system 1700 and FIG. 17.

By executing some or all of the operations of method 1400, an IC layout diagram is generated corresponding to a memory circuit including the features discussed above, thereby obtaining the benefits discussed above with respect to the various instances of DP SRAM cell 100.

Figure 15:
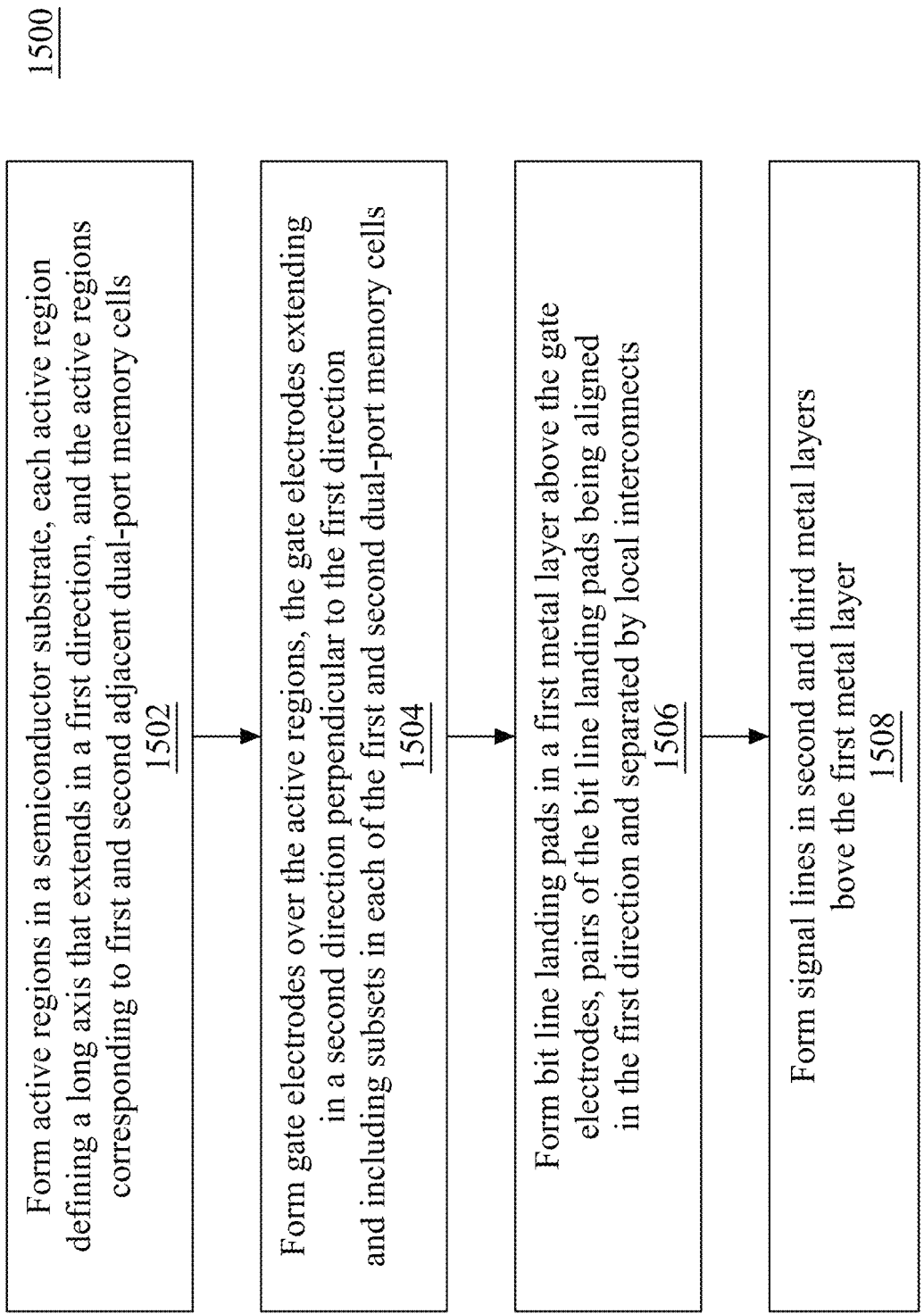
FIG. 15 is a flowchart of a method of fabricating a semiconductor device, in accordance with some embodiments.

FIG. 15 is a flowchart of a method 1500 of fabricating a semiconductor device, in accordance with some embodiments.

In some embodiments, the operations of method 1500 are performed in the order depicted in FIG. 15. In some embodiments, the operations of method 1500 are performed in an order other than the order of FIG. 15. In some embodiments, one or more additional operations are performed before, during, between, and/or after the operations of method 1500.

In some embodiments, the semiconductor device that is fabricated is a memory circuit. Method 1500 is a non-limiting example of some or all of block 1406 in FIG. 14.

At block 1502, active regions are formed in a semiconductor substrate, wherein the active regions each define a long axis that extends in a first direction, at least some of the active regions corresponding to a first dual-port memory cell and other ones of active regions corresponding to a second dual-port memory cell that is adjacent to the first dual-port memory cell. In some embodiments, the substrate is a semiconductor substrate that includes silicon, silicon germanium (SiGe), gallium arsenic, or other suitable semiconductor materials. Active regions are formed in or over the substrate, using one or more masks corresponding to one or more active regions in layout diagrams. In some embodiments, a semiconductor substrate includes semiconductor substrate 205 in FIG. 2-5. In some embodiments, active regions include active regions 226, 228, 230, 232, 234, 236, 238, 240, 242, 244 discussed above with respect to FIGS. 2 and 4 or active regions 326, 330, 334, 336, 338, 342 discussed above with respect to FIGS. 3 and 5.

In various embodiments, first and second dual-port memory cells include DP SRAM cells 202, 204 shown in FIGS. 2 and 6-8, DP SRAM cells 302, 304 in FIGS. 3 and 6-8, DP SRAM cells 402, 404 shown in FIGS. 4, 9 and 10, DP SRAM cells 502, 504 shown in FIGS. 5, 9 and 10, or DP SRAM cells 1102 shown in FIG. 11.

In some embodiments, the first direction is parallel to the Y-axis discussed above with respect to FIGS. 2-13.

At block 1504, gate electrodes are formed over the active regions, wherein the gate electrodes extend in a second direction perpendicular to the first direction and include subsets in each of the first dual-port memory cell and the second dual-port memory cell.

In an example manufacturing process, a gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof.

In some embodiments, forming the gate electrodes includes forming S/D structures in the active regions of the substrate. In at least one embodiment, the S/D structures are formed by using the gate electrodes and the spacers as a mask. For example, the formation of the S/D structures is performed by an ion implantation or a diffusion process. Depending on the type of the devices or transistors, the S/D structures are doped with p-type dopants, such as boron or BF2, n-type dopants, such as phosphorus or arsenic, and/or combinations thereof, in some embodiments.

In various embodiments, forming the gate electrodes includes forming gate electrodes 206, 208, 210, 212, 214, 216, 218, 220, 222, 224, 408A and/or 408B discussed above with respect to FIGS. 2-13.

In some embodiments, the second direction is parallel to the X-axis discussed above with respect to FIGS. 2-13.

At block 1506, bit line landing pads are formed in a first metal layer above the gate electrodes, pairs of the bit line landing pads are aligned in the first direction and separated by local interconnects.

In an example manufacturing process, a conductive layer, e.g., a metal, is deposited over the substrate with the transistors formed thereon, thereby making electrical connections to the S/D structures and gates of the transistors. A planarizing process is performed to planarize the conductive layer, resulting in conductive structures. The planarizing process includes, for example, a chemical mechanical polish (CMP) process.

In some embodiments, forming the bit line landing pads includes forming contact and/or via structures. In some embodiments, a dielectric layer is deposited over the substrate with S/D structures formed thereon. The dielectric layer is etched, and the etched portions are filled with a conductive material, such as a metal, to form one or more conductive structures, such as the contact and gate via structures. A planarizing process is performed. A conductive layer including a conductive material, such as a metal, is deposited over the planarized structure and patterned to form various conductive patterns. A dielectric layer is deposited over the patterned metal layer. The dielectric layer is etched, and the etched portions are filled with a conductive material, such as a metal, to form one or more conductive vias.

In some embodiments, forming the bit line landing pads includes forming one or more pairs of conductors 248/252, 256/259, 266/269, or 274/278 discussed above with respect to FIGS. 2-13.

In some embodiments, forming the bit line landing pads includes forming word line landing pads extending in the first direction in the first metal layer. In some embodiments, forming the bit line landing pads includes forming conductors 246, 280, and 262 or 460/464 discussed above with respect to FIGS. 2-13.

In some embodiments, forming the word line landing pads includes forming the word line landing pads at borders of the first dual-dual port memory cell and the second dual-port memory cell such that one of the word line landing pads is shared by the first dual-dual port memory cell and the second dual-port memory cell. In some embodiments, forming the bit line landing pads includes forming conductors 246, 262, and 280, including forming conductor 262 on boundary 282 discussed above with respect to FIGS. 2-13.

At block 1508, signal lines are formed in second and third metal layers above the first metal layer. Forming the signal lines includes forming word lines extending in the second direction in the second metal layer and bit lines extending in the first direction in the third metal layer.

In some embodiments, forming the word lines in the second metal layer includes forming conductors 610, 614 discussed above with respect to FIGS. 6-8. In some embodiments, forming the word lines in the second metal layer includes forming conductors 911, 919 discussed above with respect to FIGS. 9 and 10.

In some embodiments, forming the bit lines in the third metal layer includes forming conductors 624, 626, 630, 632, 634, 636, 640, 642 discussed above with respect to FIGS. 6-8. In some embodiments, forming the bit lines in the third metal layer includes forming conductors 1002, 1004, 1010, 1012, 1016, 1018, 1021, 1022 discussed above with respect to FIGS. 9 and 10.

In some embodiments, forming the signal lines includes forming word lines in a fourth metal layer above the third metal layer. In some embodiments, forming the word lines in the fourth metal layer includes forming conductors 810, 812 discussed above with respect to FIG. 8. In some embodiments, forming the word lines in the fourth metal layer includes forming conductors 1028, 1030 discussed above with respect to FIGS. 9 and 10.

By performing some or all of the operations of method 1500, a semiconductor device is manufactured corresponding to a memory circuit including the features discussed above, thereby obtaining the benefits discussed above with respect to the various instances of DP SRAM cell 100.

Figure 16:
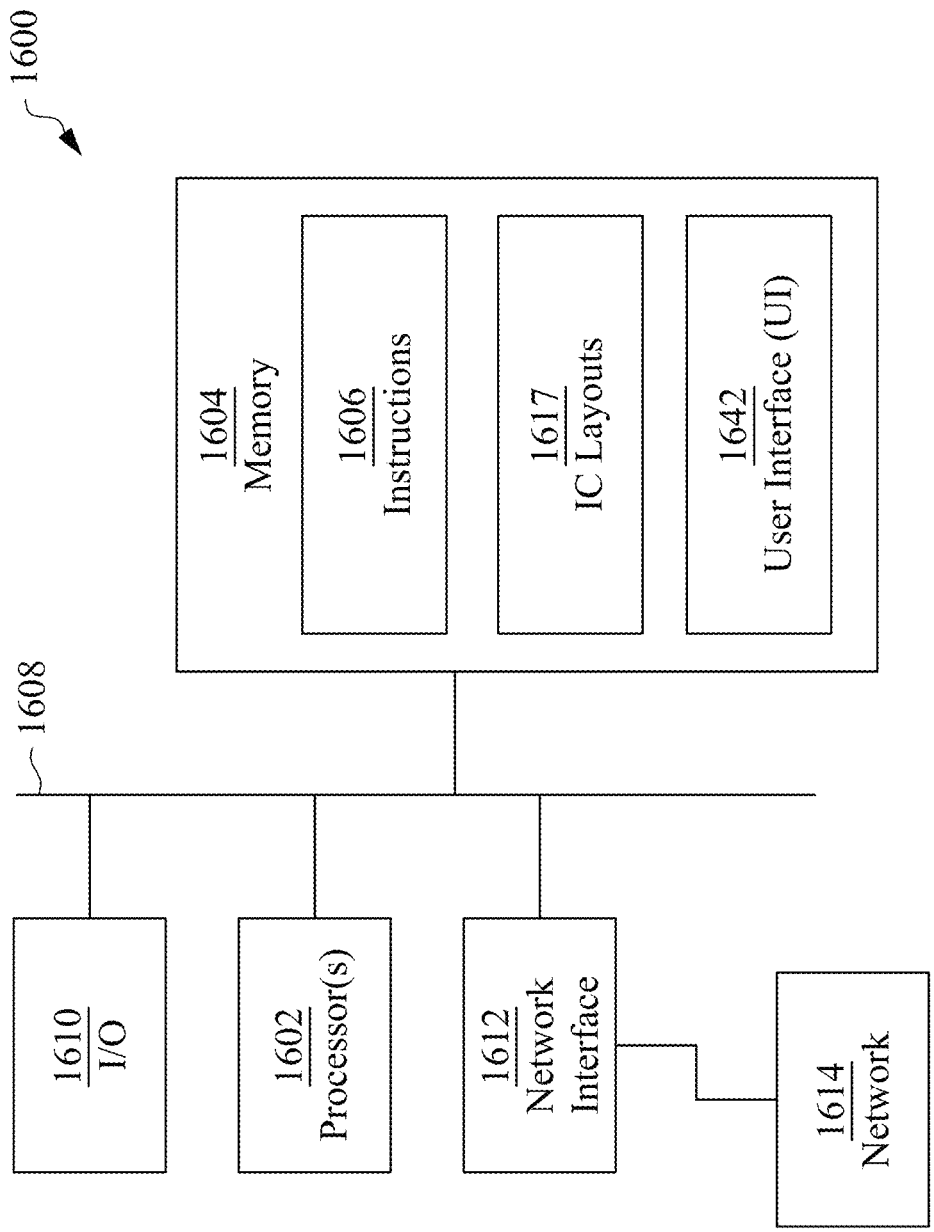
FIG. 16 is a block diagram of an EDA system, in accordance with some embodiments.

FIG. 16 is a block diagram of EDA system 1600, in accordance with some embodiments.

In some embodiments, EDA system 1600 includes an APR system. Methods described herein of designing layout diagrams, in accordance with one or more embodiments, are implementable, for example, using EDA system 1600, in accordance with some embodiments.

In some embodiments, EDA system 1600 is a general purpose computing device including a hardware processor 1602 and a non-transitory, computer-readable storage medium 1604. Storage medium 1604, amongst other things, is encoded with, i.e., stores, computer program code 1606, i.e., a set of executable instructions. Execution of instructions 1606 by hardware processor 1602 represents (at least in part) an EDA tool which implements a portion or all of the methods described herein in accordance with one or more embodiments (hereinafter, the noted processes and/or methods).

Processor 1602 is electrically coupled to computer-readable storage medium 1604 via a bus 1608. Processor 1602 is also electrically coupled to an I/O interface 1610 by bus 1608. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute computer program code 1606 encoded in computer-readable storage medium 1604 in order to cause system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DMD/VD).

In one or more embodiments, storage medium 1604 stores computer program code 1606 configured to cause system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods. In one or more embodiments, storage medium 1604 stores IC layouts 1607 including such IC layout diagrams as disclosed herein. In one or more embodiments, storage medium 1604 stores one or more layout diagrams 1609 corresponding to one or more layouts disclosed herein.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1600.

System 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a UI through I/O interface 1610. The information is stored in computer-readable medium 1604 as user interface (UI) 1642.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1600. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DMD/VD, a magnetic disk, such as a hard disk, a semiconductor memory, such as a ROM, a RAM, a memory card, and the like.

Figure 17:
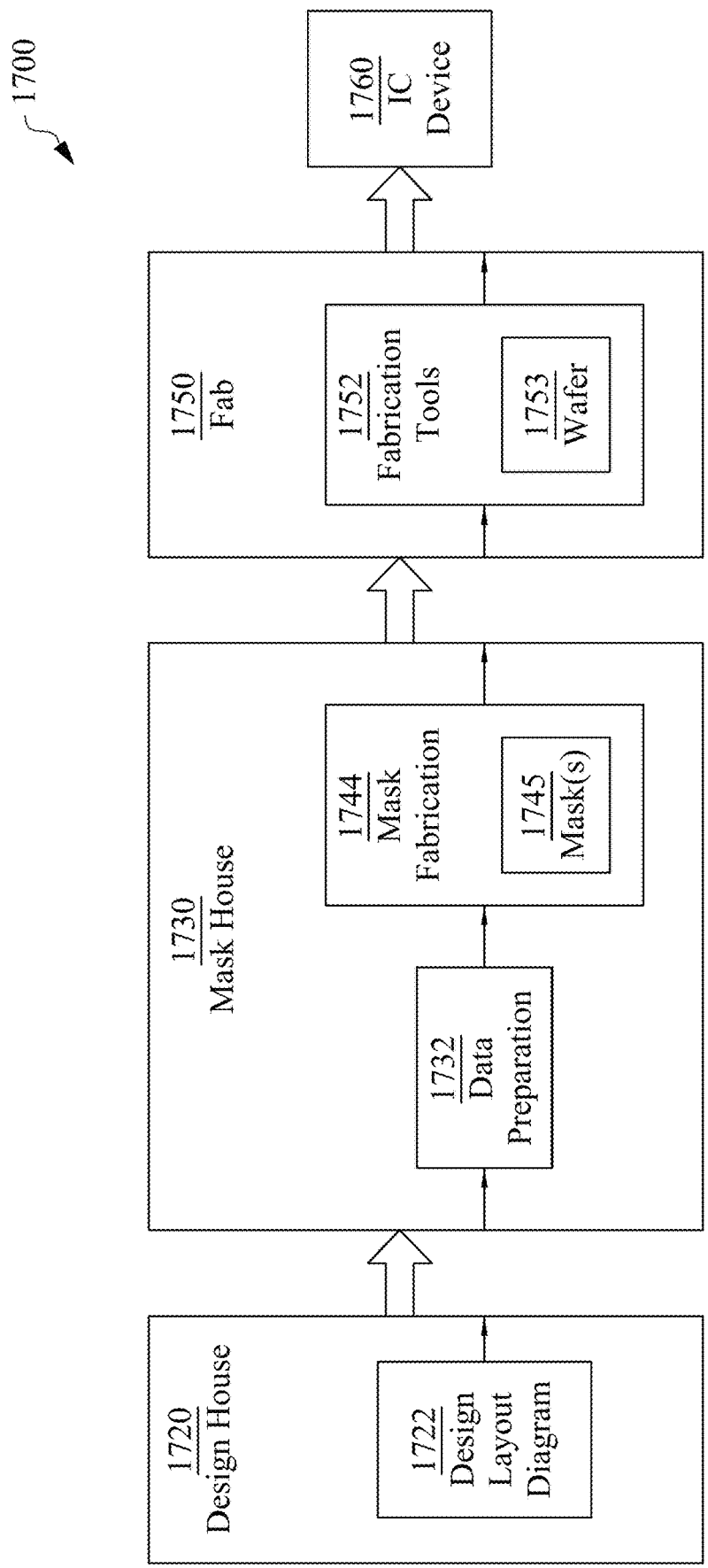
FIG. 17 is a block diagram of an IC manufacturing system, and an IC manufacturing flow associated therewith, in accordance with some embodiments.

FIG. 17 is a block diagram of IC manufacturing system 1700, and an IC manufacturing flow associated therewith, in accordance with some embodiments.

In some embodiments, based on a layout diagram, e.g., at least one of (A) one or more semiconductor masks or (b) at least one component in a layer of a semiconductor integrated circuit is fabricated using manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760. The entities in system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single larger company. In some embodiments, two or more of design house 1720, mask house 1730, and IC fab 1750 coexist in a common facility and use common resources.

Design house (or design team) 1720 generates an IC design layout diagram 1722. IC design layout diagram 1722 includes various geometrical patterns designed for an IC device 1760. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1720 implements a proper design procedure to form IC design layout diagram 1722. The design procedure includes one or more of logic design, physical design or place and route. IC design layout diagram 1722 is presented in one or more data files having information of the geometrical patterns. For example, IC design layout diagram 1722 is expressed in a GDSII file format or DFII file format.

Mask house 1730 includes data preparation 1732 and mask fabrication 1744. Mask house 1730 uses IC design layout diagram 1722 to manufacture one or more masks 1745 to be used for fabricating the various layers of IC device 1760 according to IC design layout diagram 1722. Mask house 1730 performs mask data preparation 1732, where IC design layout diagram 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a mask (reticle) 1745 or a semiconductor wafer 1753. The design layout diagram 1722 is manipulated by mask data preparation 1732 to comply with particular characteristics of the mask writer and/or requirements of IC fab 1750. In FIG. 17, mask data preparation 1732 and mask fabrication 1744 are illustrated as separate elements. In some embodiments, mask data preparation 1732 and mask fabrication 1744 is collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts IC design layout diagram 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks the IC design layout diagram 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1722.

It should be understood that the above description of mask data preparation 1732 has been simplified for the purposes of clarity. In some embodiments, data preparation 1732 includes additional features such as a logic operation (LOP) to modify the IC design layout diagram 1722 according to manufacturing rules. Additionally, the processes applied to IC design layout diagram 1722 during data preparation 1732 may be executed in a variety of different orders.

After mask data preparation 1732 and during mask fabrication 1744, a mask 1745 or a group of masks 1745 are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask (photomask or reticle) 1745 based on the modified IC design layout diagram 1722. Mask 1745 is formed in various technologies. In some embodiments, mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask is attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

IC fab 1750 is an IC fabrication business that includes one or more manufacturing facilities for the fabrication of a variety of different IC products. In some embodiments, IC Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 includes fabrication tools 1752 configured to execute various manufacturing operations on semiconductor wafer 1753 such that IC device 1760 is fabricated in accordance with the mask(s), e.g., mask 1745. In various embodiments, fabrication tools 1752 include one or more of a wafer stepper, an ion implanter, a photoresist coater, a process chamber, e.g., a CMD/VD chamber or LPCMD/VD furnace, a CMP system, a plasma etch system, a wafer cleaning system, or other manufacturing equipment capable of performing one or more suitable manufacturing processes as discussed herein.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to form IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, multi-level interconnects, and the like (formed at subsequent manufacturing steps).

Details regarding an integrated circuit (IC) manufacturing system (e.g., system 1700 of FIG. 17), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a dual-port memory cell includes a first pull-up transistor coupled to a first pull-down transistor at a first node between a supply voltage node and a reference voltage node, a second pull-up transistor coupled to a second pull-down transistor at a second node between the supply voltage node and the reference voltage node, first through fourth bit line landing pads located in a first metal layer, a first pass-gate transistor coupled between the first bit line landing pad and the first node, a second pass-gate transistor coupled between the second bit line landing pad and the second node, a third pass-gate transistor coupled between the third bit line landing pad and the first node, and a fourth pass-gate transistor coupled between the fourth bit line landing pad and the second node. The first node includes a first interconnect located in the first metal layer between the first and second bit line landing pads, and the second node includes a second interconnect located in the first metal layer between the third and fourth bit line landing pads.

In some embodiments, a dual-port memory cell includes a reference conductor in a first metal layer, a supply voltage conductor in the first metal layer, a first word line in a second metal layer above the first metal layer, a second word line in the second metal layer, a first bit line in a third metal layer above the second metal layer, a second bit line in the third metal layer, a first pull-up transistor and a first pull-down transistor coupled between a supply voltage conductor and a reference voltage conductor, a second pull-up transistor and a second pull-down transistor coupled between the supply voltage conductor and the reference voltage conductor, the first pull-up and pull-down transistors being cross-coupled with the second pull-up and pull-down transistors, a first pass-gate transistor coupled to either the first pull-up transistor or the first pull-down transistor, wherein the first pass-gate transistor is also coupled to the first bit line and the first word line, and a second pass-gate transistor coupled to either the second pull-up transistor or the second pull-down transistor, wherein the second pass-gate transistor is also coupled to the second bit line and the second word line.

In some embodiments, a method of manufacturing a memory circuit includes forming active regions in a semiconductor substrate, wherein the active regions each define a long axis that extends in a first direction, at least some of the active regions corresponding to a first dual-port memory cell and other ones of the active regions corresponding to a second dual-port memory cell that is adjacent to the first dual-port memory cell, forming gate electrodes over the active regions, wherein the gate electrodes extend in a second direction perpendicular to the first direction and include subsets in each of the first and second dual-port memory cells, forming bit line landing pads in a first metal layer above the gate electrodes, pairs of the bit line landing pads being aligned in the first direction and separated by local interconnects, and forming word lines in a second metal layer that is above the first metal layer, wherein the word lines extend in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual-port memory cell comprising:
a first pull-up transistor coupled to a first pull-down transistor at a first node between a supply voltage node and a reference voltage node;
a second pull-up transistor coupled to a second pull-down transistor at a second node between the supply voltage node and the reference voltage node;
first through fourth bit line landing pads located in a first metal layer;
a first pass-gate transistor coupled between the first bit line landing pad and the first node;
a second pass-gate transistor coupled between the second bit line landing pad and the second node;
a third pass-gate transistor coupled between the third bit line landing pad and the first node;
a fourth pass-gate transistor coupled between the fourth bit line landing pad and the second node; and
fifth through eighth bit line landing pads located in a second metal layer above the first metal layer, each of the fifth through eighth bit line landing pads being connected to a corresponding one of the first through fourth bit line landing pads,
wherein:
the first node comprises a first interconnect located in the first metal layer between the first and second bit line landing pads; and
the second node comprises a second interconnect located in the first metal layer between the third and fourth bit line landing pads.

2. The dual-port memory cell of claim 1, further comprising:
first through fourth bit lines located in a third metal layer above the second metal layer, each of the first through fourth bit lines being connected to corresponding ones of the fifth through eighth bit line landing pads.

3. The dual-port memory cell of claim 2, wherein each of the first through fourth bit line landing pads, the first and second interconnects, and the first though fourth bit lines defines a long axis that extends in a first direction.

4. The dual-port memory cell of claim 3, wherein each of the fifth through eighth bit line landing pads defines a long axis that extends in a second direction that is perpendicular to the first direction.

5. The dual-port memory cell of claim 1, further comprising:
a first word-line located in the second metal layer;
a second word-line located in the second metal layer;
a first word-line landing pad connected to the first word-line and the first pass-gate transistor, wherein the first word-line landing pad is located in the first metal layer; and
a second word-line landing pad connected to the second word-line and the second pass-gate transistor, wherein the second word-line landing pad is located in the first metal layer.

6. The dual-port memory cell of claim 5, further comprising:
a third word-line landing pad connected to the first word-line and located in a third metal layer above the second metal layer;
a fourth word-line landing pad connected to the second word-line and located in the third metal layer;
a third word-line connected to the third word-line landing pad and located in a fourth metal layer above the third metal layer; and
a fourth word-line connected to the fourth word-line landing pad and located in the fourth metal layer above the third metal layer.

7. The dual-port memory cell of claim 6, wherein:
each of the first through fourth word-line landing pads defines a long axis that extends in a first direction; and
each of the first through fourth word lines defines a long axis that extends in a second direction perpendicular to the first direction.

8. The dual-port memory cell of claim 5, wherein:
the supply voltage node comprises a supply voltage conductor located in the first metal layer; and
the reference voltage node comprises a reference voltage conductor located in the first metal layer.

9. The dual-port memory cell of claim 8, wherein the reference voltage node further comprises a second reference voltage conductor located in the second metal layer.

10. The dual-port memory cell of claim 8, wherein:
the supply voltage conductor, the reference voltage conductor, the first word-line landing pad, the second word-line landing pad, the first bit line landing pad, the second bit line landing pad, the third bit line landing pad, and the fourth bit line landing pad each define a long axis that extends in a first direction;
the first bit line landing pad and the second bit line landing pad are aligned with respect to the first direction and displaced with respect to a second direction that is perpendicular to the first direction;
the third bit line landing pad and the fourth bit line landing pad are aligned with respect to the first direction and displaced with respect to the second direction;
the supply voltage conductor is between the first word line landing pad and the third and fourth bit line landing pads with respect to the second direction;
the third and fourth bit line landing pads are between the supply voltage conductor and the reference voltage conductor with respect to the second direction;
the reference voltage conductor is between the third and fourth bit line landing pads and the first and second bit line landing pads with respect to the second direction; and
the first and second bit line landing pads are between the second word line landing pad and the reference voltage conductor with respect to the second direction.

11. The dual-port memory cell of claim 8 wherein:
the supply voltage conductor, the reference voltage conductor, the first word-line landing pad, the second word-line landing pad, the first bit line landing pad, the second bit line landing pad, the third bit line landing pad, and the fourth bit line landing pad each define a long axis that extends in a first direction;
the first bit line landing pad and the second bit line landing pad are aligned with respect to the first direction and displaced with respect to a second direction that is perpendicular to the first direction;

the third bit line landing pad and the fourth bit line landing pad are aligned with respect to the first direction and displaced with respect to the second direction;

the first word line landing pad is between the supply voltage conductor and the third and fourth bit line landing pads with respect to the second direction;

the third and fourth bit line landing pads are between the first word line landing pad and the reference voltage conductor with respect to the second direction;

the reference voltage conductor is between the third and fourth bit line landing pads and the first and second bit line landing pads with respect to the second direction; and the first and second bit line landing pads are between the reference voltage conductor and the second word line landing pad with respect to the second direction.

12. The dual-port memory cell of claim 1, further comprising:
a third pull-down transistor connected in parallel with the first pull-down transistor; and
a fourth pull-down transistor connected in parallel with the second pull-down transistor.

13. The dual-port memory cell of claim 1, wherein each of the first and second pull-up transistors and the first through fourth pass-gate transistors comprises a fin field effect transistor (FinFET).

14. A dual-port memory cell, comprising:
a supply voltage conductor in a first metal layer;
a reference voltage conductor in the first metal layer;
a first word line in a second metal layer above the first metal layer;
a second word line in the second metal layer;
a first bit line in a third metal layer above the second metal layer;
a second bit line in the third metal layer;
a first pull-up transistor and a first pull-down transistor coupled between the supply voltage conductor and the reference voltage conductor;
a second pull-up transistor and a second pull-down transistor coupled between the supply voltage conductor and the reference voltage conductor, the first pull-up and pull-down transistors being cross-coupled with the second pull-up and pull-down transistors;
a first pass-gate transistor coupled to either the first pull-up transistor or the first pull-down transistor, wherein the first pass-gate transistor is also coupled to the first bit line and the first word line; and
a second pass-gate transistor coupled to either the second pull-up transistor or the second pull-down transistor, wherein the second pass-gate transistor is also coupled to the second bit line and the second word line.

15. The dual-port memory cell of claim 14, wherein:
the supply voltage conductor and the reference voltage conductor each define a long axis that extends in a first direction;
the first word line and the second word line each define a long axis that extends in a second direction that is perpendicular to the first direction; and
the first bit line and the second bit line each define a long axis that extends in the first direction.

16. The dual-port memory cell of claim 14, further comprising:
a third bit line in the third metal layer;
a fourth bit line in the third metal layer;
a third pass-gate transistor; and
a fourth pass-gate transistor;

wherein:
the first pass-gate transistor is connected to the first pull-up transistor;
the second pass-gate transistor is connected to the second pull-down transistor;
the third pass-gate transistor is connected to first pull-down transistor, the third bit line, and the second word line; and
the fourth pass-gate transistor is connected to the second pull-up transistor, the fourth bit line, and the first word line.

17. The dual-port memory cell of claim 16, further comprising a plurality of gate electrodes, wherein:
the supply voltage conductor and the reference voltage conductor each define a long axis that extends in a first direction;
each gate electrode of the plurality of gate electrodes defines a long axis that extends in a second direction that is substantially perpendicular to the first direction;
the plurality of gate electrodes provide the gates of the first, second, third, and fourth pass-gate transistors, the first pull-up transistor, the first pull-down transistor, the second pull-up transistor, and the second pull-down transistor;
adjacent gate electrodes in the plurality of gate electrodes are separated by a gate pitch with respect to the first direction; and
a total displacement of the gates with respect to the first direction is equal to or less than four times the gate pitch.

18. The dual-port memory cell of claim 17, further comprising:
a third pull-down transistor in parallel with the first pull-down transistor; and
a fourth pull-down transistor in parallel with the second pull-down transistor;
wherein the plurality of gate electrodes include a gate of the third pull-down transistor and a gate of the fourth pull-down transistor.

19. The dual-port memory cell of claim 14, further comprising:
a first bit line landing pad in the first metal layer that is connected to the first pass-gate transistor; and
a second bit line landing pad in the second metal layer that is connected to the first bit line.

20. A dual-port memory cell comprising:
a first pull-up transistor coupled to a first pull-down transistor at a first node between a supply voltage node and a reference voltage node;
a second pull-up transistor coupled to a second pull-down transistor at a second node between the supply voltage node and the reference voltage node;
first through fourth bit line landing pads located in a first metal layer;
fifth through eighth bit line landing pads located in a second metal layer above the first metal layer, each of the fifth through eighth bit line landing pads being connected to a corresponding one of the first through fourth bit line landing pads,
a first pass-gate transistor coupled between the first bit line landing pad and the first node;
a second pass-gate transistor coupled between the second bit line landing pad and the second node;
a third pass-gate transistor coupled between the third bit line landing pad and the first node;
a fourth pass-gate transistor coupled between the fourth bit line landing pad and the second node;

a first word-line landing pad connected to the first pass-gate transistor and located in the first metal layer; and
a second word-line landing pad connected to the second pass-gate transistor and located in the first metal layer, wherein:
the first node comprises a first interconnect located in the first metal layer between the first and second bit line landing pads; and
the second node comprises a second interconnect located in the first metal layer between the third and fourth bit line landing pads.

* * * * *